(12) United States Patent
Nishitani et al.

(10) Patent No.: US 12,258,472 B2
(45) Date of Patent: Mar. 25, 2025

(54) COMPOSITION FOR CURABLE RESINS, CURED PRODUCT OF SAID COMPOSITION, PRODUCTION METHOD FOR SAID COMPOSITION AND SAID CURED PRODUCT, AND SEMICONDUCTOR DEVICE

(71) Applicant: ENEOS Corporation, Tokyo (JP)

(72) Inventors: Yoshinori Nishitani, Tokyo (JP); Tatsuki Sato, Tokyo (JP); Masaki Minami, Tokyo (JP)

(73) Assignee: ENEOS Corporation, Tokyo (JP)

( * ) Notice: Subject to any disclaimer, the term of this patent is extended or adjusted under 35 U.S.C. 154(b) by 678 days.

(21) Appl. No.: 17/606,681

(22) PCT Filed: Apr. 23, 2020

(86) PCT No.: PCT/JP2020/017580
§ 371 (c)(1),
(2) Date: Oct. 26, 2021

(87) PCT Pub. No.: WO2020/218457
PCT Pub. Date: Oct. 29, 2020

(65) Prior Publication Data
US 2022/0195188 A1 Jun. 23, 2022

(30) Foreign Application Priority Data
Apr. 26, 2019 (JP) .................................. 2019-086689

(51) Int. Cl.
| | | |
|---|---|---|
| *C08L 79/02* | (2006.01) | |
| *C08G 59/22* | (2006.01) | |
| *C08G 59/24* | (2006.01) | |
| *C08G 59/26* | (2006.01) | |
| *C08G 59/62* | (2006.01) | |
| *C08G 59/68* | (2006.01) | |
| *C08G 73/02* | (2006.01) | |
| *C08K 3/013* | (2018.01) | |
| *C08L 63/00* | (2006.01) | |
| *C08L 79/04* | (2006.01) | |
| *H01L 23/29* | (2006.01) | |
| *H01L 23/31* | (2006.01) | |

(52) U.S. Cl.
CPC .............. *C08L 79/02* (2013.01); *C08G 59/22* (2013.01); *C08G 59/24* (2013.01); *C08G 59/26* (2013.01); *C08G 59/621* (2013.01); *C08G 59/688* (2013.01); *C08G 73/0233* (2013.01); *C08K 3/013* (2018.01); *C08L 63/00* (2013.01); *C08L 79/04* (2013.01); *H01L 23/293* (2013.01); *H01L 23/295* (2013.01); *H01L 23/31* (2013.01); *C08L 2203/20* (2013.01)

(58) Field of Classification Search
CPC .......... C08L 79/02; C08L 63/00; C08L 79/04; C08L 2203/20; C08G 73/0233; C08G 59/22; C08G 59/621; C08G 59/24; C08G 59/688; C08G 59/26; C08K 3/013; H01L 23/295; H01L 23/293; H01L 29/31
See application file for complete search history.

(56) References Cited

U.S. PATENT DOCUMENTS

| | | |
|---|---|---|
| 4,395,574 A | 7/1983 | Doorakian et al. |
| 11,578,166 B2 | 2/2023 | Nishitani et al. |
| 11,584,824 B2 | 2/2023 | Nishitani et al. |
| 2004/0217376 A1 | 11/2004 | Ahsan et al. |
| 2010/0249276 A1 | 9/2010 | Dershem |
| 2014/0212658 A1 | 7/2014 | Fukuda et al. |
| 2015/0141583 A1 | 5/2015 | Arai et al. |
| 2017/0327683 A1 | 11/2017 | Hu et al. |
| 2018/0086911 A1 | 3/2018 | Yao et al. |

(Continued)

FOREIGN PATENT DOCUMENTS

| | | |
|---|---|---|
| CN | 109071918 A | 12/2018 |
| EP | 0019852 A1 | 12/1980 |

(Continued)

OTHER PUBLICATIONS

Odian, George, Principles of Polymerization, Third Edition, John Wiley & Sons, Inc., 1991, pp. 19-24.*
China National Intellectual Property Administration, Office Action in Chinese Patent Application No. 202080030737.1 (Feb. 28, 2024).
Japan Patent Office, Office Action in Japanese Patent Application No. 2021-516225 (Mar. 8, 2024).
U.S. Appl. No. 16/759,688, filed Apr. 27, 2020.
U.S. Appl. No. 16/759,704, filed Apr. 27, 2020.
U.S. Appl. No. 16/759,677, filed Apr. 27, 2020.
U.S. Appl. No. 17/311,659, filed Jun. 7, 2021.
Japanese Patent Office, International Preliminary Report on Patentability in International Patent Application No. PCT/JP2020/017580 (Sep. 28, 2021).
Japanese Patent Office, International Search Report for International Patent Application PCT/JP2020/017580 (Jul. 14, 2020).

(Continued)

*Primary Examiner* — Patrick D Niland
(74) *Attorney, Agent, or Firm* — Leydig, Voit & Mayer, Ltd.

(57) ABSTRACT

Provided is a curable resin composition being excellent in normal-temperature stability for obtaining cured product having high heat resistance, cured product thereof, methods of producing the composition and the product, and a semiconductor device using the product as sealant. Further provided is a resin composition, cured product thereof, and methods of producing the composition and the product, wherein the composition includes: (A) multifunctional benzoxazine compound having at least two benzoxazine rings, (B) epoxy compound containing at least one epoxy compound having at least one norbornane structure and at least two epoxy groups, (C) curing agent; wherein composition consisting of (A), (B), and (C) has weight-average molecular weight of 350 or more and 650 or less in terms of polystyrene. Additionally provided is a semiconductor device where semiconductor element is disposed in the cured product obtained by curing the composition containing components (A) to (C), and optionally components (D) and/or (E).

20 Claims, No Drawings

(56) References Cited

U.S. PATENT DOCUMENTS

| | | | |
|---|---|---|---|
| 2019/0119447 A1* | 4/2019 | Minami | C08G 59/621 |
| 2020/0095422 A1* | 3/2020 | Nishitani | C08G 59/688 |

FOREIGN PATENT DOCUMENTS

| | | |
|---|---|---|
| EP | 3553129 A1 | 10/2019 |
| JP | S55-157594 A | 12/1980 |
| JP | H09-048839 A | 2/1997 |
| JP | H11-130937 A | 5/1999 |
| JP | 2002-053643 A | 2/2002 |
| JP | 2005-272722 A | 10/2005 |
| JP | 2010-254895 A | 11/2010 |
| JP | 2012-036318 A | 2/2012 |
| JP | 2013-060407 A | 4/2013 |
| JP | 2016-169362 A | 9/2016 |
| JP | 2017-020011 A | 1/2017 |
| JP | 2017-045891 A | 3/2017 |
| JP | 2017-165922 A | 9/2017 |
| JP | 2018-184533 A | 11/2018 |
| JP | 2018-188611 A | 11/2018 |
| KR | 10-2014-0081817 A1 | 7/2014 |
| TW | 201516087 A | 5/2015 |
| TW | 201835140 A | 10/2018 |
| TW | 201842028 A | 12/2018 |
| WO | WO 2015/002071 A1 | 1/2015 |
| WO | WO 2017/015376 A1 | 1/2017 |
| WO | WO 2017/188448 A1 | 11/2017 |
| WO | WO 2018/105743 A1 | 6/2018 |
| WO | WO 2018/181857 A1 | 10/2018 |
| WO | WO 2019/083002 A1 | 5/2019 |
| WO | WO 2019/083004 A1 | 5/2019 |

OTHER PUBLICATIONS

Huntsman, "Tactix 742 Solid Trifunctional Epoxy Resin," Technical Data Sheet (Oct. 2012).
Japan Society of Epoxy Resin Technology (Ed.), "Outline: Epoxy resin, Basic part I," pp. 163-164, 303-304 (Nov. 19, 2003).
European Patent Office, Extended European Search Report in European Patent Application No. 18869515.9 (Mar. 31, 2021).
Japan Patent Office, International Search Report in International Patent Application No. PCT/JP2018/039821 (Jan. 15, 2019).
Japan Patent Office, International Preliminary Report on Patentability in International Patent Application No. PCT/JP2019/048200 (Jun. 8, 2021).
Japan Patent Office, International Search Report in International Patent Application No. PCT/JP2019/048200 (Mar. 10, 2020).
Korean Intellectual Property Office, Notification of Reason for Refusal in Korean Patent Application No. 10-2020-7011955 (Dec. 21, 2021).
Taiwan Patent Office, Office Action in Taiwanese Patent Application No. 107137937 (Feb. 23, 2022).
The International Bureau of WIPO, International Preliminary Report on Patentability in International Patent Application No. PCT/JP2018/039821 (Apr. 28, 2020).
Taiwan Intellectual Property Office, Office Action in Taiwanese Patent Application No. 109113875 (Jan. 19, 2024).
China National Intellectual Property Administration, Office Action in Chinese Patent Application No. 202080030737.1 (Mar. 21, 2023).

* cited by examiner

COMPOSITION FOR CURABLE RESINS, CURED PRODUCT OF SAID COMPOSITION, PRODUCTION METHOD FOR SAID COMPOSITION AND SAID CURED PRODUCT, AND SEMICONDUCTOR DEVICE

CROSS-REFERENCE TO RELATED APPLICATIONS

This application is the U.S. national phase of International Patent Application No. PCT/JP2020/017580, filed Apr. 23, 2020, which claims the benefit of Japanese Patent Application No. 2019-086689, filed on Apr. 26, 2019; the entire contents of which are incorporated herein by reference.

TECHNICAL FIELD

The present invention relates to a curable resin composition for obtaining a cured product having high heat resistance, a cured product thereof, and methods of producing the curable resin composition and the cured product. Furthermore, the present invention relates to a semiconductor device using the cured product as a sealant.

BACKGROUND ART

Thermosetting resins are used in various applications for semiconductor sealants, fiber reinforced plastics, and the like, and benzoxazine compounds are used for one of raw materials of such resins. Benzoxazine compounds refer to compounds each having a benzoxazine ring containing a benzene backbone and an oxazine backbone, and benzoxazine resins as cured products (polymerized products) thereof are excellent in physical properties such as heat resistance and mechanical strength, and are used as high-performance materials in various applications.

Patent Literature 1 discloses an epoxy resin composition containing a benzoxazine compound having a specific structure and an epoxy compound containing an aromatic ring in the main chain, and describes that the epoxy resin provides a glass transition point (Tg) of approximately 200° C. or higher.

RELATED ART DOCUMENTS

Patent Literature

[Patent Literature 1] JP-A 2010-254895

SUMMARY OF THE INVENTION

Problems to be Solved by the Invention

In fields of, for example, matrix resins for adhesives, sealants, paints, and composites, there is a need for a curable resin composition that serves for a resin cured product having high heat resistance and is further excellent in normal-temperature stability so as to be adapted for various usage environments and market conditions. However, there has not been obtained any curable resin composition that is excellent in normal-temperature stability for obtaining a cured product having high heat resistance.

Accordingly, an object of the present invention is to provide a curable resin composition that is excellent in normal-temperature stability for obtaining a cured product having high heat resistance. Another object of the present invention is to provide a cured product obtained by curing the curable resin composition, and methods of producing the curable resin composition and the cured product. Another object of the present invention is to provide a semiconductor device using the curable resin composition as a sealant.

Means for Solving the Problems

The present inventors have made intensive studies in order to achieve the above objects, and as a result, have developed a curable resin composition containing (A) a multifunctional benzoxazine compound, (B) a specific epoxy compound, and (C) a curing agent, wherein a compound consisting of (A), (B), and (C) has a specific weight-average molecular weight in terms of polystyrene. The present inventors have come to complete the present invention through the discovery that the curable resin composition is excellent in normal-temperature stability and that a cured product of the composition has excellent heat resistance.

That is, the present invention provides the following inventions.

[1] A curable resin composition including:

(A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2);

(B) an epoxy compound containing at least one epoxy compound having at least one norbornane structure and at least two epoxy groups; and (C) a curing agent, wherein a compound consisting of (A), (B), and (C) has a weight-average molecular weight of 350 or more and 650 or less in terms of polystyrene,

[Chem. 1]

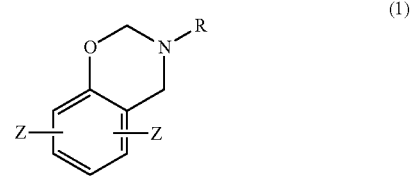

(1)

wherein in the formula (1), R represents a linear alkyl group having 1 to 12 carbon atoms, a cyclic alkyl group having 3 to 8 carbon atoms, or an aryl group having 6 to 14 carbon atoms, wherein the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and the benzoxazine rings are linked by the linking group,

[Chem. 2]

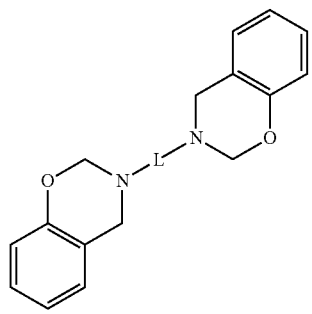

(2)

wherein in the formula (2), L represents a divalent organic group having 1 to 5 aromatic rings or an alkylene group having 2 to 10 carbon atoms, and the organic group and the alkylene group optionally contain oxygen and/or sulfur.

[2] The curable resin composition according to [1], wherein (B) the epoxy compound having at least one norbornane structure and at least two epoxy groups is an alicyclic epoxy compound.

[3] The curable resin composition according to [1] or [2], wherein (B) the epoxy compound having at least one norbornane structure and at least two epoxy groups has no glycidyl group.

[4] The curable resin composition according to any one of [1] to [3], wherein (B) the epoxy compound further contains at least one selected from the group consisting of epoxy compounds having a biphenyl backbone, trisphenolmethane type epoxy compounds, naphthalene type epoxy compounds, novolac type epoxy compounds, and phenolaralkyl type epoxy compounds.

[5] The curable resin composition according to any one of [1] to [4], further containing (D) a curing accelerator.

[6] The curable resin composition according to any one of [1] or [5], further containing (E) an inorganic filler.

[7] A cured product obtained by curing the curable resin composition according to any one of [1] to [6].

[8] A semiconductor device, wherein a semiconductor element is disposed in a cured product obtained by curing the curable resin composition according to any one of [1] to [6].

[9] A method of producing the curable resin composition according to any one of [1] to [6], the method including the steps of: mixing (A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) an epoxy compound containing at least one epoxy compound having at least one norbornane structure and at least two epoxy groups, and (C) a curing agent, to obtain a mixture; and processing the mixture into a powdery, pelletized, or granular curable resin composition,

[Chem. 3]

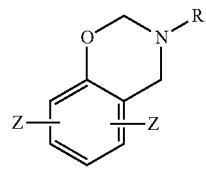

(1)

wherein in the formula (1), R represents a linear alkyl group having 1 to 12 carbon atoms, a cyclic alkyl group having 3 to 8 carbon atoms, or an aryl group having 6 to 14 carbon atoms, wherein the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different; at least one Z represents a linking group, and the benzoxazine rings are linked by the linking group;

[Chem. 4]

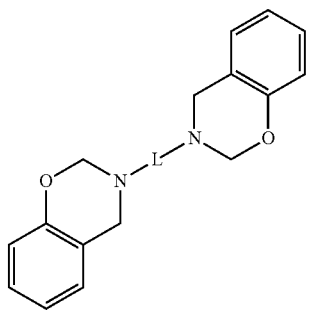

(2)

wherein in the formula (2), L represents a divalent organic group having 1 to 5 aromatic rings or an alkylene group having 2 to 10 carbon atoms, and the organic group and the alkylene group optionally contain oxygen and/or sulfur.

[10] The production method according to [9], wherein the step of obtaining a mixture includes further mixing (D) a curing accelerator and/or (E) an inorganic filler to obtain the mixture.

[11] A method of producing a cured product, comprising a step of heating the curable resin composition produced by the method according to [9] or [10], at 150 to 300° C. for 20 seconds to 5 hours for curing.

Effects of the Invention

The curable resin composition of the present invention is a novel curable resin composition containing components (A) to (C), and further, if desired, components (D) and (E), and is characterized in that the curable resin composition is excellent in normal-temperature stability, and that a cured product of the composition has excellent heat resistance. Accordingly, the curable resin composition of the present invention can be used in applications in which normal-temperature stability is demanded, and still a cured product of the composition needs to have heat resistance, for example, applications of adhesives, sealants, paints, and matrix resins for composite materials. In particular, the curable resin composition of the present invention not only can exert excellent sealing performance as a semiconductor element sealant but also can contribute to high reliability of a semiconductor device. In addition, the present invention makes it possible that a compound consisting of components (A) to (C) serves as an agent for improving the normal-temperature stability of the curable resin composition and/or the heat resistance of the cured product.

MODE FOR CARRYING OUT THE INVENTION

Curable Resin Composition

Hereinafter, the present invention will be described in detail. It is noted that each "compound" in components (A), (B), and (C) in the present invention encompasses not only a monomer represented in each formula, but also an oligomer obtained by polymerization of a small amount of the monomer, namely, a prepolymer before formation of a curable resin. Accordingly, the curable resin composition of the present invention may be any resin composition that can be cured.
(Component A)

Component (A) that constitutes the curable resin composition is at least one multifunctional benzoxazine compound having at least two benzoxazine rings, selected from a multifunctional benzoxazine compound having a structural unit of formula (1) and a multifunctional benzoxazine compound represented by a structure of formula (2). Herein, in the above described formula (1), each Z represents hydrogen, a substituent and/or a linking group (spacer) and is optionally the same or different, at least one Z represents a linking group, and the benzoxazine rings are linked by the linking group. The linking group as used here encompasses two benzoxazine rings directly bound via no other group. Examples of the substituent include a hydrocarbon group having 1 to 8 carbon atoms.

Accordingly, the formula (1) represents the structural unit of any compound wherein two or more benzoxazine rings are linked at a benzene ring moiety, among options of component (A).

The multifunctional benzoxazine compound of formula (1) can be more specifically represented as having a structure represented by formula (1a):

[Chem. 5]

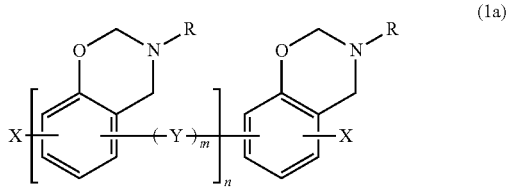

(1a)

wherein in the formula (1a), R represents a linear alkyl group having 1 to 12 carbon atoms, a cyclic alkyl group having 3 to 8 carbon atoms, or an aryl group having 6 to 14 carbon atoms, wherein the aryl group optionally has halogen or a linear alkyl group having 1 to 12 carbon atoms, as a substituent; each R is optionally the same or different; each X represents hydrogen or a hydrocarbon group having 1 to 8 carbon atoms, and is optionally the same or different; Y represents an alkylene group having 1 to 6 carbon atoms, oxygen, sulfur, a $SO_2$ group, or a carbonyl group; m is 0 or 1; and n is an integer of 1 to 10.

Specific examples of R in formulae (1) and (1a) can include the following groups.

Examples of the linear alkyl group having 1 to 12 carbon atoms include a methyl group, an ethyl group, a propyl group, an isopropyl group, an n-butyl group, an isobutyl group, and a t-butyl group.

Examples of the cyclic alkyl group having 3 to 8 carbon atoms include a cyclopentyl group and a cyclohexyl group.

Examples of the aryl group having 6 to 14 carbon atoms include a phenyl group, a 1-naphthyl group, a 2-naphthyl group, a phenanthryl group, and a biphenyl group.

The aryl group having 6 to 14 carbon atoms is optionally substituted, and examples of the substituent include a linear alkyl group having 1 to 12 carbon atoms, and halogen. Examples of the aryl group having 6 to 14 carbon atoms, substituted with a linear alkyl group having 1 to 12 carbon atoms or halogen, include an o-tolyl group, a m-tolyl group, a p-tolyl group, a xylyl group, an o-ethylphenyl group, a m-ethylphenyl group, a p-ethylphenyl group, an o-t-butylphenyl group, a m-t-butylphenyl group, a p-t-butylphenyl group, an o-chlorophenyl group, and an o-bromophenyl group.

R is preferably selected from a methyl group, an ethyl group, a propyl group, a phenyl group and a p-tolyl group, from the viewpoint of favorable handleability.

Component (A) may also be a mixture of a plurality of kinds of compounds represented in one of formulae (1) and (1a), which are different in R from each other.

Examples of the hydrocarbon group having 1 to 8 carbon atoms as Z in formula (1) and X in formula (1a) include an alkyl group, an aryl group, and an aralkyl group, and an aryl group is preferable.

Examples of the multifunctional benzoxazine compound represented by formula (1) or (1a) can include a compound represented by the following formula (1X), and an oligomer obtained by polymerization of small amounts of the compound.

[Chem. 6]

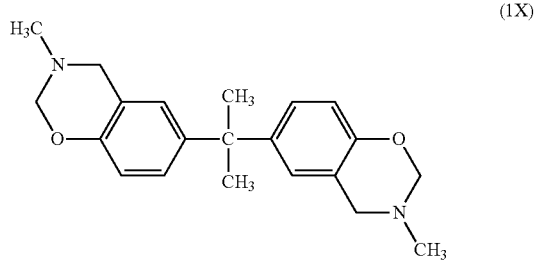

(1X)

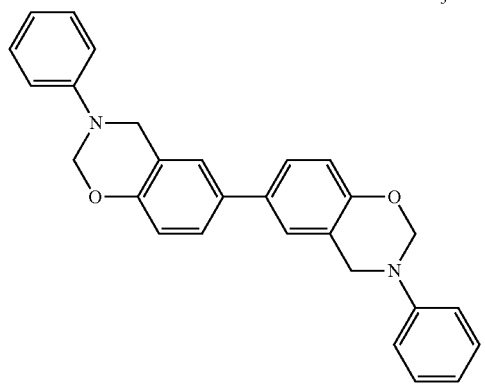

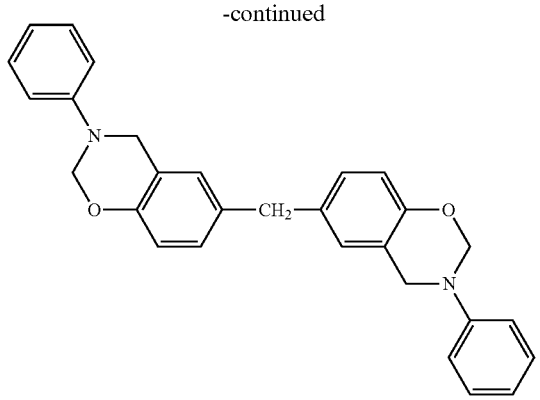
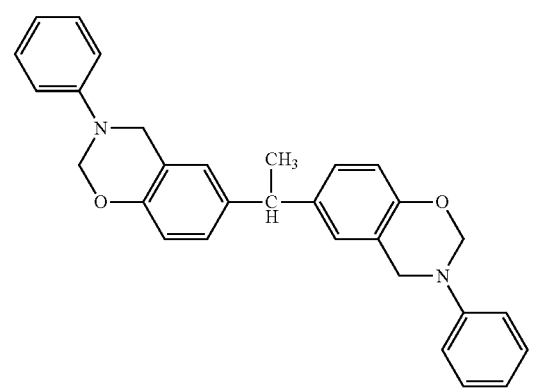
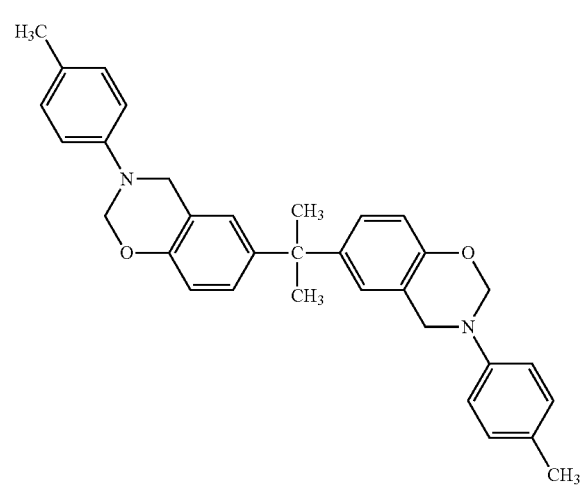
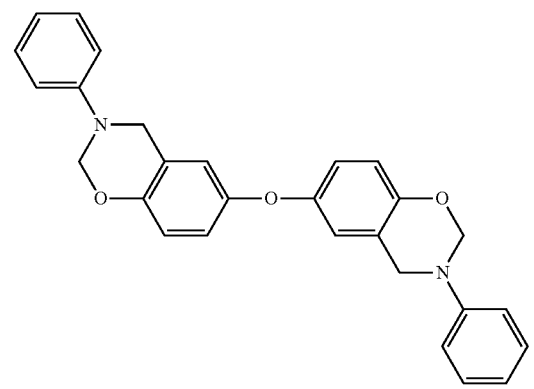
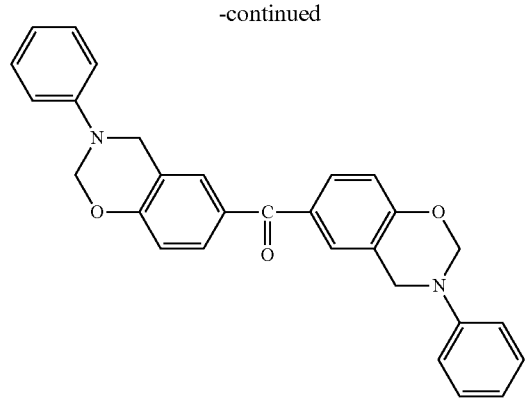
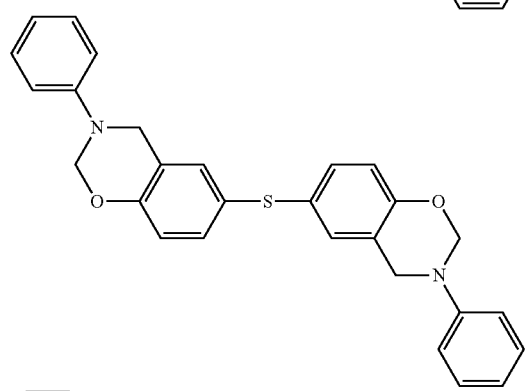
The multifunctional benzoxazine compound of formula (2), as another option of the component (A), is a compound wherein the respective nitrogen atoms (N atoms) in two benzoxazine rings are bound via a linking group L,
[Chem. 7]
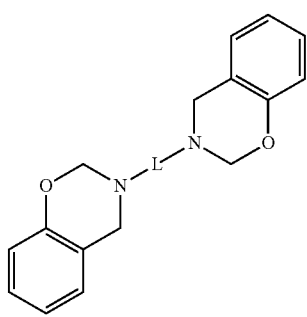
(2)

wherein in the formula (2), L represents a divalent organic group having 1 to 5 aromatic rings or an alkylene group having 2 to 10 carbon atoms, and the organic group and the alkylene group optionally contain oxygen and/or sulfur.

The composition of the present invention may contain, as component (A), a plurality of kinds of multifunctional benzoxazine compounds represented by formula (2), which are different in L.

In cases where L in formula (2) represents an aromatic ring-containing group, the group contains 1 to 5 aromatic rings, and examples thereof include a monocyclic compound, a multicyclic compound, and a fused ring compound. L may also contain at least one selected from the group consisting of oxygen and sulfur.

Specific examples can include a group represented by the following formula (3).

[Chem. 8]

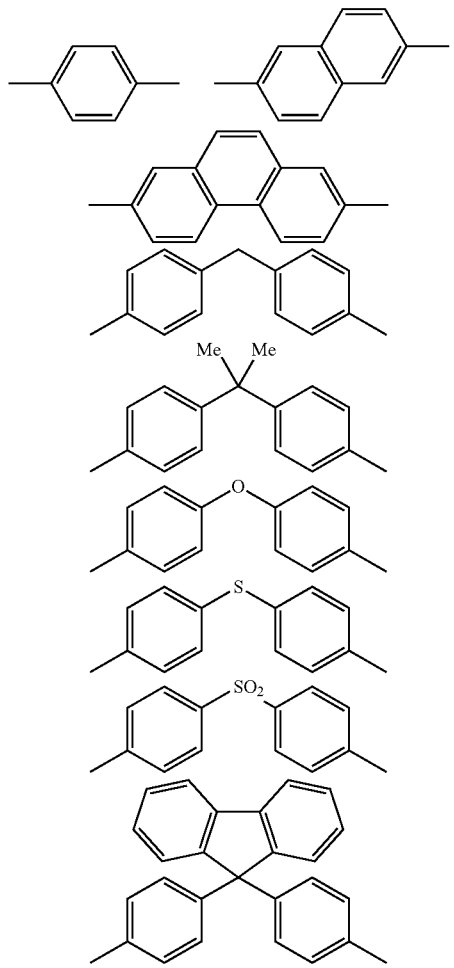

(3)

In cases where L in formula (2) represents an alkylene group, the alkylene group has, for example, 1 to 10 carbon atoms, preferably 1 to 6 carbon atoms. Specific examples of the alkylene group include a methylene group, an ethylene group, and an isopropylidene group, and preferably include a methylene group.

Examples of the multifunctional benzoxazine compound of formula (2) can include a compound represented by the following formula (2X), and an oligomer obtained by polymerization of the compound, for example, an oligomer obtained by polymerization of a small amount of the compound.

[Chem. 9]

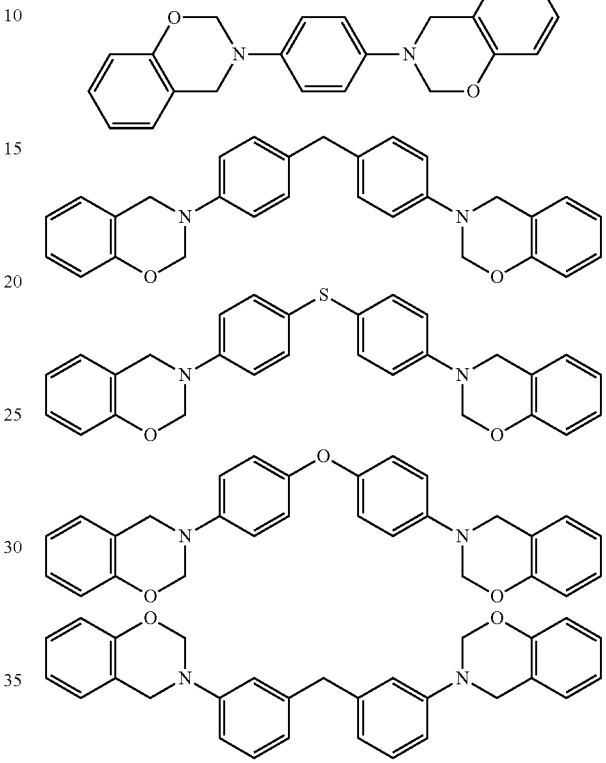

(2X)

Any commercially available product can also be used as the multifunctional benzoxazine compound in the component (A). Examples of such a commercially available product can include bisphenol F-aniline (F-a)-type benzoxazine and phenol-diaminodiphenylmethane (P-d)-type benzoxazine (both are manufactured by SHIKOKU CHEMICALS CORPORATION).

(Component B)

Component (B) that constitutes the curable resin composition is an epoxy compound. Such an epoxy compound contains at least one epoxy compound having at least one norbornane structure and at least two epoxy groups. As long as the effects of the present invention are not impaired, the composition of the present invention may further contain, as component (B), an epoxy compound other than the epoxy compound having at least one norbornane structure and at least two epoxy groups. Such an epoxy compound other than the epoxy compound having at least one norbornane structure and at least two epoxy groups is, for example, an epoxy compound having a biphenyl backbone, a trisphenolmethane type epoxy compound, a naphthalene type epoxy compound, a novolac type epoxy compound, or a phenolaralkyl type epoxy compound, preferably an epoxy compound having a biphenyl backbone or a trisphenolmethane type epoxy compound. The epoxy compound other than the epoxy compound having at least one norbornane structure and at least two epoxy groups may be a plurality of such compounds.

(Epoxy Compound Having at Least One Norbornane Structure and at Least Two Epoxy Groups)

The epoxy compound having at least one norbornane structure and at least two epoxy groups is not particularly limited as long as the compound does not impair the effects of the present invention. The epoxy compound is preferably an alicyclic epoxy compound, more preferably has an epoxy structure, represented by the following formula (4), bound to a 5-membered ring, a 6-membered ring, or a norbornane ring. Here, the alicyclic epoxy compound is a compound having an epoxy group being a reactive group on an alicyclic backbone. Accordingly, example of a more preferable alicyclic epoxy compound includes an epoxy compound having a structure in which a carbon-carbon bond of a 5-membered ring, 6-membered ring, or norbornane ring is shared as the carbon-carbon bond of an epoxy group, as shown by the following formula (4), preferably a compound having no glycidyl group. Using such a compound makes it possible to achieve high heat resistance.

These may be used singly or in combination of two or more kinds thereof.

[Chem. 10]

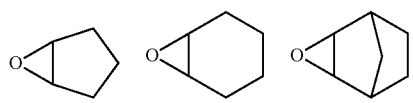

(4)

Specific examples of the alicyclic epoxy compound can include a compound represented by the following formula (5).

[Chem. 11]

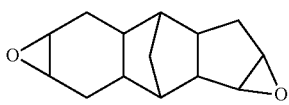

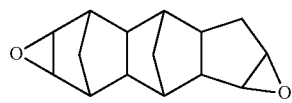

(5)

A production example of the multifunctional epoxy compound in the component (B) will be described.

A compound of the following formula (5-1) can be produced by, for example, synthesizing a compound (a) having the following norbornane structure, by a Diels-Alder reaction of butadiene and dicyclopentadiene, and then reacting the compound (a) and meta-chloroperbenzoic acid, as represented in the following formula (6).

[Chem. 12]

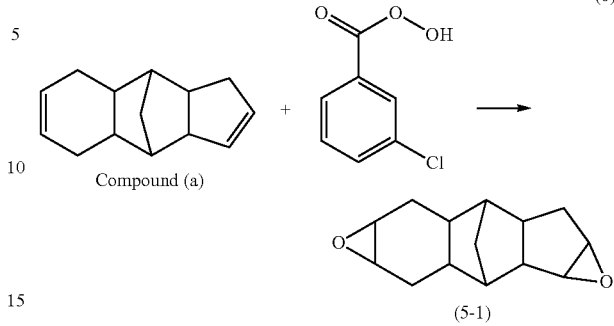

(6)

(5-1)

A compound of the following formula (5-2) can be produced by, for example, synthesizing a compound (b) (tricyclopentadiene) having the following norbornane structure, by a Diels-Alder reaction of cyclopentadiene and dicyclopentadiene, and then reacting the compound (b) and meta-chloroperbenzoic acid, as represented in the following formula (7).

[Chem. 13]

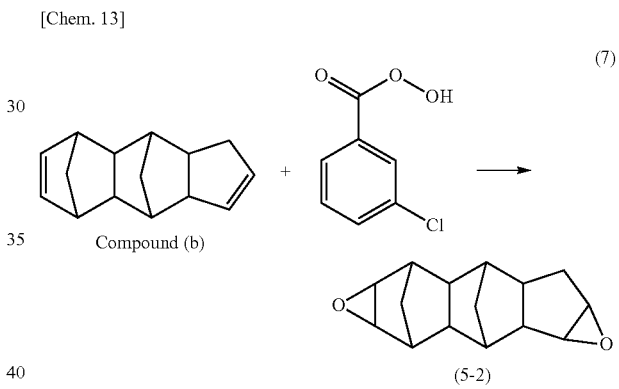

(7)

(5-2)

A compound of the following formula (5-3) can be produced by, for example, synthesizing a compound (c) having the following norbornane structure, by a Diels-Alder reaction of butadiene and cyclopentadiene, and then reacting the compound (c) and meta-chloroperbenzoic acid, as represented in the following formula (8).

[Chem. 14]

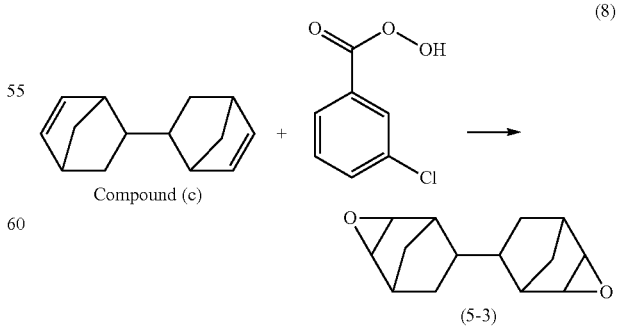

(8)

(5-3)

A compound of the following formula (5-4) can be produced by, for example, reacting dicyclopentadiene and potassium peroxymonosulfate (oxone). The compound of formula (5-4), dicyclopentadiene diepoxide, may also be any commercially available product, and examples of such a commercially available product can include dicyclopentadiene diepoxide manufactured by SHANDONG QIHUAN BIOCHEMICAL CO., LTD.

[Chem. 15]

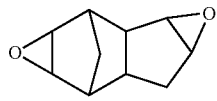

(5-4)

(Epoxy Compound Having a Biphenyl Backbone)

The epoxy compound having a biphenyl backbone is not particularly limited as long as the compound does not impair the effects of the present invention. Such a compound is preferably an epoxy compound represented by a structure of the following formula (9-1) or (9-2). As the epoxy compound having a biphenyl backbone, any one of an epoxy compound represented by a structure of the following formula (9-1) and an epoxy compound represented by a structure of the following formula (9-2) may be used singly, or in mixture of two kinds thereof. The epoxy compound having a biphenyl backbone is more preferably an epoxy compound represented by a structure of the following formula (9-1):

[Chem. 16]

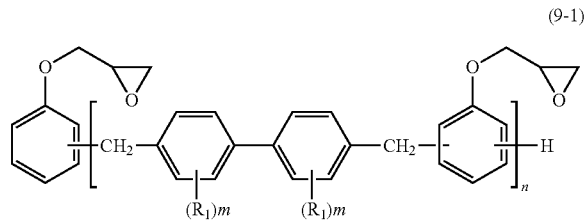

(9-1)

wherein in the formula (9-1), $R_1$s are each a substituent, being an alkyl group having 1 to 4 carbon atoms, and are optionally the same or different; m represents the number of the substituent(s) $R_1$ and is an integer of 0 to 4; and n represents an average value and is 1 to 5,

[Chem. 17]

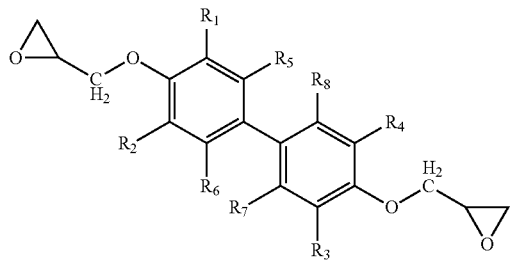

(9-2)

wherein in the formula (9-2), $R_1$ to $R_8$ represent a hydrogen atom, a halogen atom, or an alkyl group having 1 to 4 carbon atoms, and are optionally the same or different.

In formula (9-1), m is preferably 0 to 2, more preferably 0. In formula (9-1), n is preferably 1 to 5, more preferably 1 to 4. Examples of the alkyl group having 1 to 4 carbon atoms in the substituent $R_1$ of formula (9-1) include a methyl group, an ethyl group, a propyl group, a butyl group, and the like. The substituent $R_1$ is preferably a methyl group or an ethyl group. Furthermore, the epoxy compound having a biphenyl backbone may be a mixture of compounds represented by formula (9-1), wherein the compounds are different from each other in $R_1$, m, or n in the formula.

Examples of the alkyl group having 1 to 4 carbon atoms in $R_1$ to $R_8$ of formula (9-2) include a methyl group, an ethyl group, a propyl group, a butyl group, and the like. $R_1$, $R_2$, $R_3$, $R_4$, $R_5$, $R_6$, $R_7$, or $R_8$ are each preferably a hydrogen atom or a methyl group. Furthermore, the epoxy compound having a biphenyl backbone may be a mixture of compounds represented by formula (9-2), wherein the compounds are different from each other in $R_1$ to $R_8$ in the formula.

In the other preferred embodiment of the present invention, the epoxy compound having a biphenyl backbone used in the present invention is represented by formula (9-2) wherein $R_1$, $R_2$, $R_3$, and $R_4$ are each an alkyl group having 1 to 4 carbon atoms, and $R_5$, $R_6$, $R_7$, and $R_8$ are each a hydrogen atom. In still the other preferred embodiment of the present invention, the epoxy compound having a biphenyl backbone used in the present invention is represented by formula (9-2), wherein $R_1$, $R_2$, $R_3$, and $R_4$ are each a methyl group, and $R_5$, $R_6$, $R_7$, and $R_8$ are each a hydrogen atom.

Any commercially available product can also be used as the epoxy compound having a biphenyl backbone. Examples of commercially available products of epoxy compounds represented by a structure of formula (9-1) include: NC-3000 (a tradename; from NIPPON KAYAKU CO., LTD.), NC-3000-L (a tradename; from NIPPON KAYAKU CO., LTD.), NC-3000-H (a tradename; from NIPPON KAYAKU CO., LTD.), NC-3000-FH-75M (a tradename; from NIPPON KAYAKU CO., LTD.), NC-3100 (a tradename; from NIPPON KAYAKU CO., LTD.), and the like. Examples of commercially available products of epoxy compounds represented by a structure of formula (9-2) include: YX4000 (a tradename; from MITSUBISHI CHEMICAL CORPORATION), YX4000H (a tradename; from MITSUBISHI CHEMICAL CORPORATION), YL6121H (a tradename; from MITSUBISHI CHEMICAL CORPORATION), and the like. These may be used singly or in combination of two or more kinds thereof.

(Trisphenolmethane Type Epoxy Compound)

The trisphenolmethane type epoxy compound is not particularly limited as long as the compound does not impair the effects of the present invention. Such a compound is preferably an epoxy compound represented by a structure of the following formula (10),

[Chem. 18]

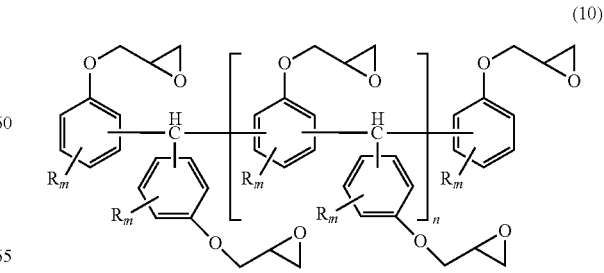

(10)

wherein in the formula (10), R is a substituent and independently represents an alkyl group having 1 to 6 carbon atoms, an allyl group or a phenyl group; m represents the number of the substituent(s) R and is an integer of 0 to 3; and n represents an average value, satisfying 0≤n≤10.

In formula (10), m is preferably 0 to 2, more preferably 0. In formula (10), n is preferably 0 or more and 5 or less. Examples of the alkyl group having 1 to 6 carbon atoms in the substituent R of formula (10) include a methyl group, an ethyl group, a propyl group, a butyl group, a cyclohexyl group, and the like. The substituent R is preferably a methyl group. Furthermore, the trisphenolmethane type epoxy compound may be a mixture of compounds represented by formula (10), wherein the compounds are different from each other in R, m, or n in the formula.

Any commercially available product can also be used as the trisphenolmethane type epoxy compound. Examples of such a commercially available product include EPPN-501H (a tradename; manufactured by NIPPON KAYAKU CO., LTD.), EPPN-501HY (a tradename; manufactured by NIPPON KAYAKU CO., LTD.), EPPN-502H (a tradename; manufactured by NIPPON KAYAKU CO., LTD.), EPPN-503 (a tradename; manufactured by
NIPPON KAYAKU CO., LTD.), and the like. These may be used singly or in combination of two or more kinds thereof.

(Naphthalene Type Epoxy Compound)

The naphthalene type epoxy compound is not particularly limited as long as the compound does not impair the effects of the present invention. Such a compound is, for example, a naphthyleneether type epoxy compound, binaphthalene type epoxy compound, naphthol type epoxy compound, or the like, preferably a naphthyleneether type epoxy compound or a binaphthalene type epoxy compound.

(Naphthyleneether Type Epoxy Compound)

The naphthyleneether type epoxy compound is not particularly limited as long as the compound does not impair the effects of the present invention. Such a compound is preferably an epoxy compound represented by a structure of the following formula (11),

[Chem. 19]

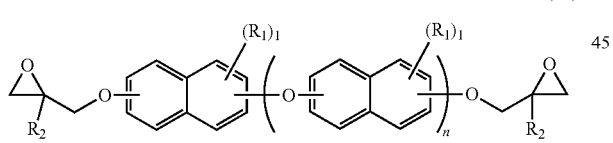

(11)

wherein in the formula (11), n is an integer of 1 to 20; I is an integer of 0 to 2; $R_1$ is a substituent and independently represents a benzyl group, an alkyl group, or a structure represented by formula (11a); and $R_2$ independently represents a hydrogen atom or a methyl group,

[Chem. 20]

(11a)

wherein in the formula (11a), Ar independently represents a phenylene group or a naphthylene group; $R_2$ independently represents a hydrogen atom or a methyl group; and m is an integer of 1 or 2.

Furthermore, the naphthyleneether type epoxy compound may be a mixture of compounds represented by formula (11), wherein the compounds are different from each other in $R_1$, $R_2$, I, or n in the formula.

Examples of naphthyleneether type epoxy compounds represented by the general formula (11) include one represented by formula (11-1),

[Chem. 21]

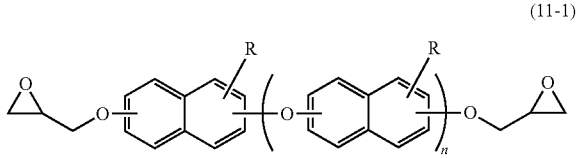

(11-1)

wherein in the formula (11-1), n is an integer of 1 to 20, preferably an integer of 1 to 10, more preferably an integer of 1 to 8; and R is a substituent and independently represents a benzyl group, an alkyl group, a structure represented by the following general formula (11a-1), or not present, and the substituent R is preferably not present,

[Chem. 22]

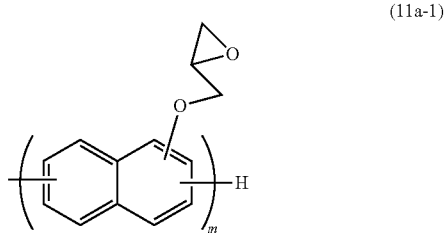

(11a-1)

wherein in the general formula (11a-1), m is an integer of 1 or 2.

Examples of naphthyleneether type epoxy compounds represented by formula (11-1) include one represented by formulae (11-2) to (11-6),

[Chem. 23]
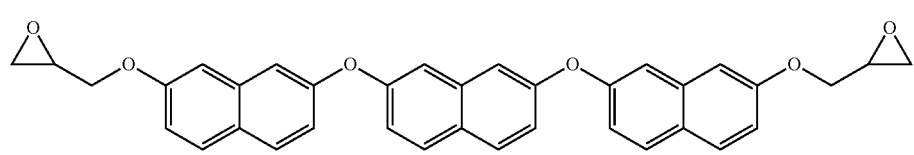
(11-2)
[Chem. 24]
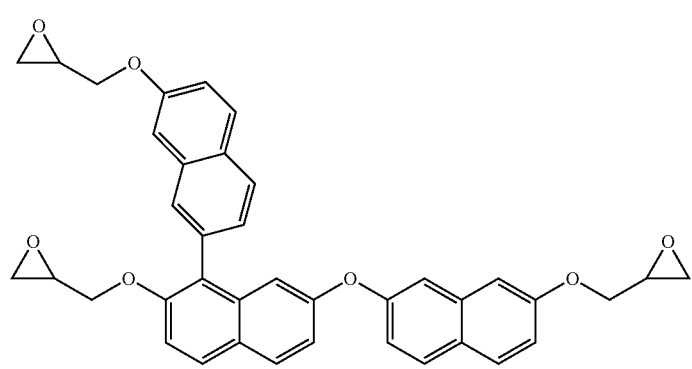
(11-3)
[Chem. 25]
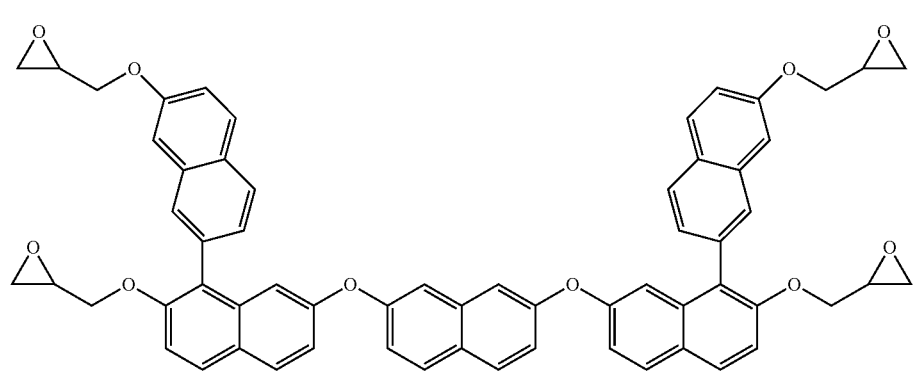
(11-4)
[Chem. 26]
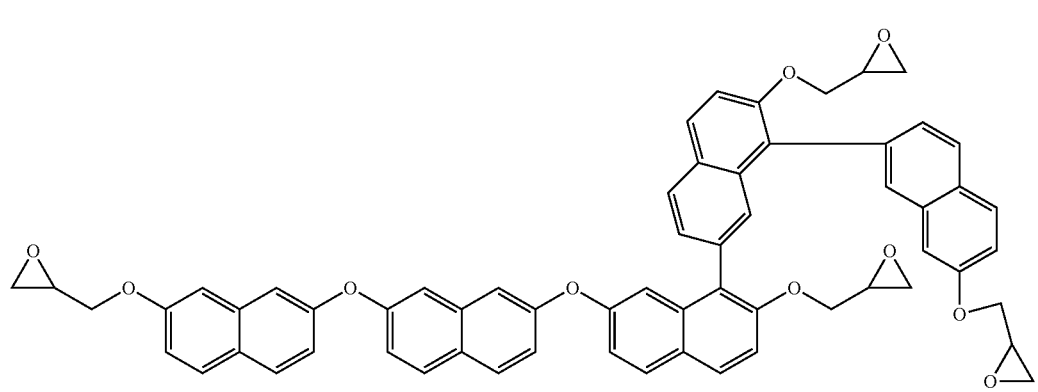
(11-5)
[Chem. 27]
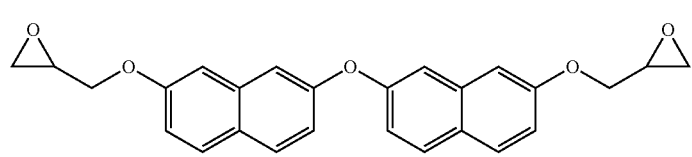
(11-6)

Any commercially available product can also be used as the naphthyleneether type epoxy compound. Examples of commercially available products of the naphthyleneether type epoxy compound include HP-6000 (a tradename; from DIC CORPORATION), EXA-7310 (a tradename; from DIC CORPORATION), EXA-7311 (a tradename; from DIC CORPORATION), EXA-7311L (a tradename; from DIC CORPORATION), EXA-7311-G3 (a tradename; from DIC CORPORATION), and the like. These may be used singly or in combination of two or more kinds thereof.

(Binaphthalene Type Epoxy Compound)

The binaphthalene type epoxy compound is not particularly limited as long as the compound does not impair the effects of the present invention and does not contain the above naphthyleneether type epoxy compound. Such a compound is preferably an epoxy compound represented by a structure of the following formula (12),

[Chem. 28]

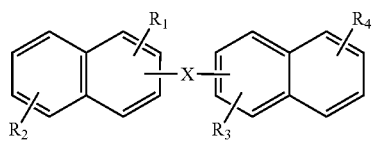

(12)

wherein in the formula (12), X represents an alkylene group having 1 to 8 carbon atoms; $R_1$ to $R_4$ represent any one of a group represented by the following formula (12a), hydrogen atom, halogen atom, phenyl group, and alkyl group having 1 to 4 carbon atoms; $R_1$ to $R_4$ may be added to any ring of the naphthalene backbone, or may be simultaneously added to both the rings; and $R_1$ to $R_4$ needs to include an average of 2 or more groups represented by the following general formula (12a), and the other Rs may be the same or different.

[Chem. 29]

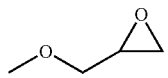

(12a)

Furthermore, the binaphthalene type epoxy compound may be a mixture of compounds represented by formula (12), wherein the compounds are different from each other in $R_1$ to $R_4$ or X in the formula.

The binaphthalene type epoxy compound is, for example, a bifunctional or more multifunctional binaphthalene type epoxy compound, preferably a bifunctional, trifunctional, or tetrafunctional binaphthalene type epoxy compound, more preferably a bifunctional binaphthalene type epoxy compound represented by the following formula (12-1).

[Chem. 30]

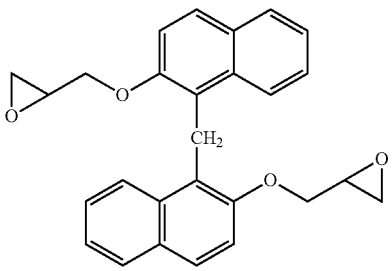

(12-1)

Any commercially available product can also be used as the binaphthalene type epoxy compound. Examples of commercially available products of the bifunctional binaphthalene type epoxy compounds include HP-4770 (a tradename; from DIC CORPORATION) and the like. Examples of commercially available products of trifunctional binaphthalene type epoxy compounds include EXA-4750 (a tradename; from DIC CORPORATION) and the like. Examples of commercially available products of tetrafunctional binaphthalene type epoxy compounds include HP-4710 (a tradename; from DIC CORPORATION), HP-4700 (a tradename; from DIC CORPORATION), and the like. These may be used singly or in combination of two or more kinds thereof.

(Novolac Type Epoxy Compound)

The novolac type epoxy compound is not particularly limited as long as the compound does not impair the effects of the present invention. Any commercially available product can also be used as such a compound. Examples of commercially available products of novolac type epoxy compounds include N-730A (a tradename; from DIC CORPORATION), N-865 (a tradename; from DIC CORPORATION), and the like. These may be used singly or in combination of two or more kinds thereof.

(Phenolaralkyl Type Epoxy Compound)

The phenolaralkyl type epoxy compound is not particularly limited as long as the compound does not impair the effects of the present invention. Any commercially available product can also be used as such a compound.

The compounding ratio between component (A) the multifunctional benzoxazine compound and component (B) the epoxy compound is preferably 30 parts by mass or more and 180 parts by mass or less, more preferably 50 parts by mass or more and 130 parts by mass or less, in terms of the compounding ratio of component (B) with respect to 100 parts by mass of component (A). When the compounding ratio between component (A) and component (B) is in the above range, it is possible to obtain more excellent heat resistance.

In cases where the composition of the present invention contains a plurality of kinds of the multifunctional benzoxazine compounds as component (A), the total of such compounds is assumed to be 100 parts by mass. In cases where the composition of the present invention contains a plurality of kinds of epoxy compounds as component (B), component (B) means the total of such a plurality of compounds.

In cases where the epoxy compound of the component (B) further contains an epoxy compound other than the epoxy compound having at least one norbornane structure and at least two epoxy groups (hereinafter referred to as a norbornane structure-containing epoxy compound), the compounding ratio between the norbornane structure-containing epoxy compound and the epoxy compound other than the norbornane structure-containing epoxy compound (mass ratio) (the norbornane structure-containing epoxy compound: the epoxy compound other than the norbornane structure-containing epoxy compound) is, for example, 85:15 to 15:85, preferably 70:30 to 30:70, and more preferably 60:40 to 40:60. When the compounding ratio is in the above range, it is possible to obtain a curable resin composition being more excellent in normal-temperature stability and a cured product having more excellent heat resistance.

In cases where the composition of the present invention contains, as component (B), a plurality of kinds of epoxy compounds other than the norbornane structure-containing epoxy compound, the compounding amount of the epoxy compound other than the norbornane structure-containing epoxy compound means the total compounding amount of such a plurality of compounds.

(Component C)

Component (C) that constitutes the curable resin composition is a curing agent.

Specific examples of component (C) include phenolic curing agents, aromatic amines (for example, diethyltoluenediamine, metaphenylenediamine, diaminodiphenylmethane, diaminodiphenylsulfone, metaxylenediamine, and derivatives thereof), aliphatic amines (for example, triethylenetetramine and isophoronediamine), imidazoles (for example, imidazole and imidazole derivatives), dicyandiamide, tetramethylguanidine, carboxylic anhydrides (for example, methylhexahydrophthalic anhydride), carboxylic acid hydrazides (for example, adipic acid hydrazide), carboxylic acid amides, polymercaptans, carboxylates, and Lewis acid complexes (for example, boron trifluoride ethylamine complex). Examples of the phenolic curing agent include monofunctional phenol and multifunctional phenol compounds (for example, bisphenol A, bisphenol F, dihydroxynaphthalene, bisphenol sulfide (for example, bis(4-hydroxyphenyl) sulfide and the like), polyphenol compounds (for example, pyrogallol and the like), phenol resins (for example, novolac type phenol resins, phenolaralkyl resins having a phenylene backbone, phenolaralkyl resins having a biphenyl backbone, naphtholaralkyl resins having a phenylene backbone, trisphenolmethane type phenol resins (triphenylmethane type phenol resins, also referred to as phenol resins containing, as the main component, a reaction product of the following: hydroxybenzaldehyde, formaldehyde, and phenol), copolymers of a triphenylmethane type phenol compound and a novolac type phenol compound, and dicyclopentadiene-modified phenol resins, and the like), and the like). Component (C) is preferably a phenolic curing agent, more preferably a multifunctional phenol compound, still more preferably a bisphenol F phenol resin, still more preferably bisphenol F, a novolac type phenol resin, phenolaralkyl resin having a phenylene backbone, or phenolaralkyl resin having a biphenylene backbone. These may be used singly or in mixture of two or more kinds thereof.

Any commercially available product can also be used as the phenolic curing agent of component (C). Examples thereof include bisphenol F (manufactured by HONSHU CHEMICAL INDUSTRY CO., LTD.), bis(4-hydroxyphenyl) sulfide (TDP, manufactured by TOKYO CHEMICAL INDUSTRY CO., LTD.), 2,7-dihydroxynaphthalene (manufactured by TOKYO CHEMICAL INDUSTRY CO., LTD.), pyrogallol (manufactured by TOKYO CHEMICAL INDUSTRY CO., LTD.), novolac type phenol resins (for example, ferrite TD-2106, from DIC CORPORATION; and ferriteTD-2090, from DIC CORPORATION), phenolaralkyl resins having a phenylene backbone (for example, MEH-7800-4S, manufactured by MEIWA PLASTIC INDUSTRIES, LTD.), phenolaralkyl resins having a biphenyl backbone (for example, MEHC-7851SS, manufactured by MEIWA PLASTIC INDUSTRIES, LTD.), and triphenylmethane type phenol resins (HE910-20, manufactured by AIR WATER INC.; and TPM-100, manufactured by GUNEI CHEMICAL INDUSTRY CO., LTD.). These may be used singly or in combination of two or more kinds thereof.

The compounding ratio between the multifunctional benzoxazine compound as component (A) and the total of the epoxy compound as component (B) and the curing agent as component (C) is preferably 40 parts by mass or more and 200 parts by mass or less, more preferably 60 parts by mass or more and 150 parts by mass or less, in terms of the compounding ratio of the total of components (B) and (C) with respect to 100 parts by mass of component (A).

When the compounding ratio between component (A) and the total of components (B) and (C) is in the above range, it is possible to obtain a curable resin composition being more excellent in normal-temperature stability and a cured product having more excellent heat resistance.

In cases where the composition of the present invention contains a plurality of kinds of multifunctional benzoxazine compounds as component (A), the total of such compounds is assumed to be 100 parts by mass. In cases where the composition of the present invention contains a plurality of kinds of epoxy compounds as component (B), the "compounding ratio of component (B)" means the total ratio of such a plurality of compounds. Further, in cases where the composition of the present invention contains a plurality of kinds of curing agents as component (C), the "compounding ratio of component (C)" means the total ratio of such a plurality of curing agents.

The weight-average molecular weight of a compound consisting of (A), (B), and (C) in terms of polystyrene is, for example, 350 or more and 650 or less, preferably 350 or more and 600 or less, or 400 or more and 650 or less, more preferably 350 or more and 550 or less, or 450 or more and 600 or less. When the weight-average molecular weight is 350 or more and 650 or less, it makes the curable resin composition less sticky at room temperature and easy to handle. Accordingly, when the weight-average molecular weight is 350 or more and 650 or less, it is possible to obtain a curable resin composition being more excellent in normal-temperature stability.

In the present invention, the weight-average molecular weight of a compound consisting of (A), (B), and (C) in terms of polystyrene can be determined by gel permeation chromatography (GPC) measurement and in terms of standard polystyrene. Such measurement and conversion can be performed in a simple manner using a commercially available GPC device (for example, manufactured by Tosoh Corporation) and a column (for example, TSKgel SuperHZ2000 (manufactured by Tosoh Corporation) and TSKgel SuperHZ1000 (manufactured by Tosoh Corporation)). The above-mentioned measurement and conversion can be performed, for example, under the below-mentioned conditions. Device: GPC system HLC-8420GPC (with an RI detector built in) (manufactured by Tosoh Corporation); Column: TSKgel superHZ2000 (manufactured by Tosoh Corporation) (4.5 mm in inner diameter×150 mm)×1, and TSKgel superHZ1000 (manufactured by Tosoh Corporation) (4.5 mm in inner diameter×150 mm)×2; Eluent: tetrahydrofuran, at a flow rate of 0.35 mL/min; Detector: RI detector; Column temperature: 40° C.; Injection volume: 5

µL; Molecular weight standard: standard polystyrene (PStQuick F, manufactured by Tosoh Corporation).

In this regard, such a usable compound consisting of (A), (B), and (C) is a compound obtained by kneading (A), (B), and (C) on a hot plate with the surface temperature set to 100° C., under atmospheric pressure for 5 minutes, then cooling the resultant at room temperature to obtain a mixture, and then grinding the mixture into powdery form with a mortar.

(Component D)

The curable resin composition of the present invention may further contain, if desired, (D) a curing accelerator.

A known curing accelerator can be used as the curing accelerator, and examples thereof include, but are not limited to: amine-based compounds such as tributylamine and 1,8-diazabicyclo(5,4,0)undecene-7; imidazole-based compounds such as 2-methylimidazole, 2-ethylimidazole, and 1,2-dimethylimidazole; and organophosphorus compounds including organophosphorus compounds with phosphorus bound by only a covalent bond, such as triphenylphosphine, and salt-type organophosphorus compounds with phosphorus bound by a covalent bond and an ionic bond, such as tetraphenylphosphonium tetraphenylborate, bis(tetrabutylphosphonium) (BTBP)-pyromellitic acid, and tetrabutylphosphonium 2,6-bis[(2-hydroxy-5-methylphenyl) methyl]-4-methylphenolate (TBP-3PC). The above-mentioned curing accelerators may be used singly or in combination of two or more kinds thereof. In particular, organophosphorus compounds such as triphenylphosphine, tetraphenylphosphonium tetraphenylborate, BTBP-pyromellitic acid, and TBP-3PC exert a higher effect of enhancing the speed of curing and thus are preferable.

Such a organophosphorus compound described above preferably exerts a function of promoting a crosslinking reaction of an epoxy group and a phenolic hydroxyl group, as described in JP-A S55-157594. Furthermore, such a organophosphorus compound described above preferably exerts also a function of promoting a reaction of an epoxy group and a hydroxyl group generated in a cleavage reaction of (A) the multifunctional benzoxazine compound at high temperatures.

The compounding ratio of component (D) is preferably in the range of 0.01 part by mass or more and 10 parts by mass or less, more preferably in the range of 0.1 part by mass or more and 5 parts by mass or less, in terms the compounding ratio of component (D) with respect to 100 parts by mass of the total of components (A), (B), and (C). When the component (D) is contained in such a range, it is possible to provide a curable resin composition having more excellent fast curability.

(Component E)

The curable resin composition of the present invention may further contain, if desired, (E) an inorganic filler. For example, in cases where a curable resin composition of the present invention is used for a sealant of a semiconductor element or the like, the composition preferably contains component (E). The inorganic filler for use in the present invention is not particularly limited, and can be selected in consideration of an application of the curable resin composition or a cured product thereof, or characteristics to be provided. Hereinafter, the inorganic filler is referred to as component (E).

Examples of component (E) include oxides such as silica, alumina, titanium oxide, zirconium oxide, magnesium oxide, cerium oxide, yttrium oxide, calcium oxide, antimony trioxide, and zinc oxide; carbonates such as calcium carbonate, magnesium carbonate, barium carbonate and strontium carbonate; sulfates such as barium sulfate, aluminum sulfate and calcium sulfate; nitrides such as aluminum nitride, silicon nitride, titanium nitride, boron nitride and manganese nitride; silicon compounds such as calcium silicate, magnesium silicate and aluminum silicate; boron compounds such as aluminum borate; zirconium compounds such as barium zirconate and calcium zirconate; phosphorus compounds such as zirconium phosphate and magnesium phosphate; titanium compounds such as strontium titanate, calcium titanate, magnesium titanate, bismuth titanate, barium titanate and potassium titanate; minerals such as mica, talc, kaolin, kaolin clay, kaolinite, halloysite, cordierite, pyrophyllite, montmorillonite, sericite, amesite, bentonite, asbestos, wollastonite, sepiolite, xonotlite, zeolite, hydrotalcite, hydrated gypsum, alum, diatomaceous earth and boehmite; fly ash, dewatered sludge, glass beads, glass fibers, silica sand, magnesium oxysulfate, silicon oxide, and silicon carbide; metals such as copper, iron, and nickel, or alloys including any of such metals; magnetic materials such as sendust, alnico magnet, ferrites such as soft magnetic ferrite, iron oxide, chromium oxide, cobalt, and non-oxidized metal magnetic material (oxide); and graphite and coke. Component (E) is preferably silica, alumina, or a magnetic material. Examples of the silica include molten silica, spherical silica, crystalline silica, amorphous silica, synthetic silica, and hollow silica, preferably spherical silica or crystalline silica. Examples of the alumina include spherical alumina, pulverized alumina, or microspherical alumina, preferably spherical alumina or microspherical alumina. Examples of preferable magnetic materials include soft magnetic ferrites, iron oxide, chromium oxide, cobalt, non-oxidized metal magnetic materials (oxides), and the like. Component (E) may be used singly or in combination of two or more kinds thereof.

Component (E) may be particulate, and in such a case, the average particle size thereof is not particularly limited, and may be, for example, 0.01 µm or more and 150 µm or less, preferably 0.1 µm or more and 120 µm or less, more preferably 0.5 µm or more and 75 µm or less. Such a range leads to an improvement in packing ability into a mold cavity in use of the composition of the present invention in, for example, a sealant application of a semiconductor element. The average particle size of component (E) can be measured by a laser diffraction/scattering method. Specifically, the average particle size can be determined by creating the particle size distribution of the inorganic filler on a volume basis, with a laser diffraction-type particle size distribution measuring apparatus, and defining the median size as the average particle size. A measurement sample that can be used is preferably obtained by ultrasonically dispersing the inorganic filler in water. The laser diffraction-type particle size distribution measuring apparatus that can be used is, for example, "LA-500", "LA-750", "LA-950" or "LA-960" manufactured by HORIBA LTD.

The compounding ratio of component (E) is not limited to any particular value, and can be appropriately selected depending on its application, as long as a cured product having high heat resistance can be obtained. For example, in cases where the composition is used in a semiconductor-sealing application, the following compounding ratio is preferable.

The lower limit value of the compounding ratio of component (E) is, for example, 150 parts by mass or more, preferably 400 parts by mass or more, and more preferably 500 parts by mass or more, with respect to 100 parts by mass in total of components (A), (B), and (C). The upper limit value of the compounding ratio of the component (E) is, for example, 1300 parts by mass or less, preferably 1150 parts by mass or less, and more preferably 950 parts by mass or less. The lower limit value of the compounding ratio of component (E) is 400 parts by mass or more, thereby enabling an increase in amount of moisture absorption and a reduction in strength according to curing of the curable resin composition to be suppressed, and thus enabling a cured product having more favorable solder cracking resistance to be obtained. The upper limit value of the compounding ratio of component (E) is 1300 parts by mass or less, thereby allowing the curable resin composition to have better fluidity and thus be easily packed into a mold, resulting in exertion of favorable sealing performance of a cured product (Other Component(s))

The composition of the present invention may contain a benzoxazine compound other than component (A), as long as the effects of the present invention are not impaired. For example, in cases where the composition is demanded to be reduced in viscosity, a monofunctional benzoxazine compound having one benzoxazine ring may be added to the composition.

For example, nano-carbon, a flame retardant, a release agent, a colorant, a low-stress additive, a metal hydroxide, and/or the like can be compounded into the curable resin composition of the present invention, as long as the performances of the curable resin composition are not impaired.

Examples of the nano-carbon include carbon nanotube, fullerene, and respective derivatives.

Examples of the flame retardant include red phosphorus; phosphates such as triphenyl phosphate, tricresyl phosphate, trixylenyl phosphate, cresyl diphenyl phosphate, xylenyl diphenyl phosphate, resorcinol bis-phenyl phosphate, bisphenol A bis-diphenyl phosphate; borates; and phosphazene.

Examples of release agents include: stearates; natural waxes such as carnauba wax; synthetic waxes such as oxidized polyethylene wax; higher fatty acids such as stearic acid or esters thereof; metal salts such as zinc stearate; paraffin; and silicone oil.

Examples of colorants include carbon black, colcothar, and titanium oxide.

Examples of low-stress additives include silicone oil and silicone rubber.

Examples of metal hydroxides include hydroxides such as calcium hydroxide, aluminum hydroxide, and magnesium hydroxide.

In cases where component (E) the inorganic filler is contained, a silane coupling agent may be compounded together.

The compounding ratio of the other component(s) is preferably in the range of 0.01 parts by mass or more and 10 parts by mass or less, and more preferably in the range of 0.1 parts by mass or more and 9 parts by mass or less, in terms of the compounding ratio of the other component(s) with respect to 100 parts by mass in total of the components (A), (B), and (C).

(Characteristics of Curable Resin Composition)

The normal-temperature stability of a curable resin composition of the present invention can be evaluated according to the glass transition temperature (powder Tg), stickiness, and/or consolidation properties of the curable resin composition prior to curing.

The glass transition temperature of the curable resin composition is, for example, 3° C. or more, preferably 5° C. or more, and more preferably 6° C. or more. The glass transition temperature can be measured by differential scanning calorimetry (DSC). Such measurement can be simply performed by use of a commercially available differential scanning calorimeter (for example, manufactured by HITACHI HIGH-TECH SCIENCE CORPORATION).

A curable resin composition of the present invention is preferably not sticky. The stickiness of the curable resin composition, that is, whether the curable resin composition is sticky, can be verified by a verification test described below.

Verification test: a curable resin composition prior to curing is sampled in a bottle, the bottle is hermetically sealed with a lid, and then, the composition is stored for 24 hours in a thermostatic chamber adjusted to a temperature of 23±1° C. and a humidity of 50±5%. Then, the bottle is turned upside down and left to stand, and after five minutes, a judgement can be made according to whether the composition is adhered to the bottom of the bottle.

Further details of the verification test can be performed in accordance with the description of the below-mentioned Example 1.

In cases where a curable resin composition of the present invention contains component (E), it is preferable that the curable resin composition is not consolidated, or that, even if consolidated, the composition is loosened when the bottle is turned upside down. The consolidation properties of the curable resin composition, that is, whether the curable resin composition is consolidated, can be verified by a verification test described below.

Verification test: a curable resin composition prior to curing is sampled in a bottle, the bottle is hermetically sealed with a lid, and then, the composition is stored for 24 hours in a thermostatic chamber adjusted to a temperature of 23±1° C. and a humidity of 50±5%. Then, the bottle is turned upside down and left to stand, and after five minutes, the composition is visually observed to judge whether the composition is consolidated.

Further details of the verification test can be performed in accordance with the description of the below-mentioned Example 15.

[Method of Producing Curable Resin Composition]

Next, a method of producing the curable resin composition of the present invention will be described.

A curable resin composition of the present invention can be produced by the steps of: kneading or mixing components (A) to (C), and further, if desired, adding component (D), component (E), the other component(s) such as other additive(s), and a solvent to obtain a mixture; and processing the mixture into a powdery, pelletized, or granular curable resin composition.

The kneading or mixing method is not particularly limited, and the mixing can be made using, for example, a mixing apparatus or a kneading machine such as a planetary mixer, a twin-screw extruder, a heat roll, or a kneader. For example, in cases where components (A), (B), and (C) are highly viscous liquids or solids at room temperature or in cases where component (E) is contained, the components may be kneaded under heating, if necessary, and may be further kneaded under pressure or under reduced pressure. The heating temperature is preferably 80 to 120° C.

The curable resin composition which contains component (E) is a solid at room temperature, and thus may be heated and kneaded, and thereafter cooled and pulverized to provide a powder, or the powder may be tableted and thus formed into pellets. The powder may also be granulated into granule form.

In cases where the curable resin composition of the present invention does not contain the component (E), and is used in an application of prepregs for FRP, the curable resin composition preferably has a viscosity of 10 to 3000 Pa·s at 50° C. The viscosity is more preferably 10 to 2500 Pa·s, and still more preferably 100 to 2000 Pa·s. In cases where the curable resin composition of the present invention is used in a sealant or coating application, the viscosity is not limited, as long as working such as sealing or coating is not impaired.

[Cured Product]

The cured product of the curable resin composition of the present invention is characterized by having a high glass transition temperature and having excellent heat resistance. The reason why such an excellent cured product is formed by the curable resin composition of the present invention is considered as follows.

In the homopolymerization of benzoxazine, a phenolic hydroxyl group is first produced by polymerization. It is considered that this phenolic hydroxyl group undergoes keto-enol tautomerization at a high temperature, for example, 200° C. or higher, thereby resulting in cleavage of polymer chains, and thus causing lower heat resistance as well as lower glass transition temperature.

On the contrary, it is considered that the multifunctional epoxy compound having a norbornane structure and two or more epoxy groups, of the present invention, is hardly homopolymerized and reacts with the phenolic hydroxyl group derived from benzoxazine to thereby prevent the cleavage of polymer chains. Thus, a cured product having high heat resistance can be obtained.

(Characteristics of Cured Product)

The heat resistance of a cured product of the present invention can be evaluated by measuring the glass transition temperature. The glass transition temperature of the cured product is, for example, 220° C. or higher, preferably 225° C. or higher, and more preferably 230° C. or higher. In cases where the curable resin composition contains component (E), the glass transition temperature of the cured product is, for example, 230° C. or higher, preferably 235° C. or higher, more preferably 240° C. or higher. The glass transition temperature can be measured by differential scanning calorimetry (DSC). Such measurement can be simply performed by use of a commercially available differential scanning calorimeter (for example, manufactured by HITACHI HIGH-TECH SCIENCE CORPORATION).

[Method of Producing Cured Product]

A cured product of the present invention can be produced by performing ring-opening polymerization for curing, under the same curing conditions as those for known benzoxazine compounds and/or epoxy compounds. Examples include the following methods.

First, a curable resin composition of the present invention is produced by the above-mentioned method. Subsequently, the resulting curable resin composition can be heated at, for example, 150 to 300° C. for a curing time of, for example, 20 seconds to 5 hours, preferably 20 seconds to 1 hour, to obtain a cured product. While a curing time of 1 to 3 minutes is sufficient for continuous production of the cured product, it is preferable to further heat for approximately 5 minutes to 5 hours in post-curing for achieving a higher strength.

In the cases where a film-shaped molded product is obtained as the cured product, a solvent can further be compounded to provide a composition which has a suitable solution viscosity for film formation. The solvent is not particularly limited as long as the components (A) to (D) can be dissolved therein, and examples thereof include hydrocarbons, ethers, esters, and halogen-containing solvents.

In the case of such a solution-type curable resin composition dissolved in the solvent, the cured product can be obtained by coating a substrate with the solution-type curable resin composition, thereafter volatilizing the solvent, and then performing thermal curing.

[Semiconductor Device]

The semiconductor device of the present invention is a semiconductor device where a semiconductor element is disposed in a cured product obtained by curing the curable resin composition of the present invention, the composition containing components (A) to (C), and, if desired, component (D), component (E), and/or the other component(s). The semiconductor element is here usually supported and secured by a lead frame being a thin plate of a metallic material. The phrase "semiconductor element is disposed in a cured product" means that the semiconductor element is sealed by a cured product of the curable resin composition, and represents the state where the semiconductor element is covered with the cured product. In such a case, the entire semiconductor element may be covered, or the surface of the semiconductor element disposed on a base plate may be covered.

In cases where the semiconductor device is produced by sealing any of various electronic components, such as a semiconductor element, with the cured product of the present invention, the semiconductor device can be produced by performing a sealing step according to a conventional molding method, such as transfer molding, compression molding or injection molding.

EXAMPLES

Hereinafter, the present invention will be specifically described with reference to Examples and Comparative Examples; however, the present invention is not intended to be limited to such Examples.

<Component (A): Multifunctional Benzoxazine Compound>

The following compound was used as component (A).

(A): Phenol-diaminodiphenylmethane (P-d)-type benzoxazine represented by the following formula (2-1) (manufactured by SHIKOKU CHEMICALS CORPORATION)

[Chem. 31]

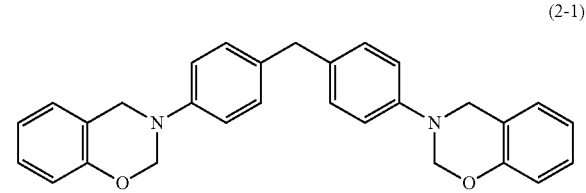

(2-1)

<Component (B): Epoxy Compound>

The following (B1) to (B5) were used as component (B).

(B1) Epoxy compound 1 (alicyclic epoxy compound): compound of formula (5-1)

The compound (a) represented in formula (6) was synthesized according to a method described in "Shoichi Tsuchida et al., "Diels-Alder Reaction between Butadiene and Cyclopentadiene-Determination of Trimers-", *Journal of the Japan Petroleum Institute*, 1972, Vol. 15, Issue 3, pages 189 to 192".

Next, the reaction of formula (6) was performed as follows. A reaction vessel was charged with 23.5 kg of chloroform and 1.6 kg of the compound (a), and 4.5 kg of meta-chloroperbenzoic acid was added dropwise thereto with stirring at 0° C. The temperature was raised to room temperature, and the reaction was performed for 12 hours.

Next, meta-chlorobenzoic acid as a by-product was removed by filtration, and thereafter, the filtrate was washed with an aqueous 1 N sodium hydroxide solution three times, and then washed with saturated saline. After the organic layer was dried over magnesium sulfate, the magnesium sulfate was removed by filtration and the filtrate was concentrated, to obtain a crude product.

To the crude product was added 2 kg of toluene, to dissolve the crude product at room temperature. Thereto was added dropwise 6 kg of heptane for crystallization, and the resultant was aged at 5° C. for 1 hour. The resultant crystallized product was collected by filtration and washed with hexane. The product was dried under reduced pressure at 35° C. for 24 hours, to obtain 1.4 kg of a compound represented by the following formula (5-1), as a white solid.

[Chem. 32]

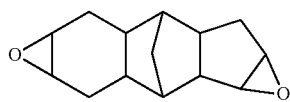

(5-1)

(B2) Epoxy compound 2 (epoxy compound having a biphenyl backbone): epoxy compound having a biphenyl backbone (NC-3000-H, manufactured by NIPPON KAYAKU CO., LTD.). represented by the following formula (9-1-1)

[Chem. 33]

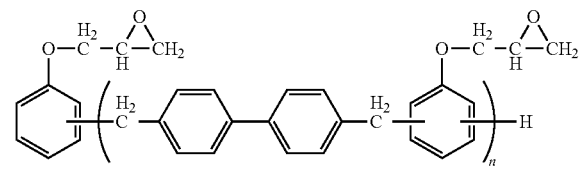

(9-1-1)

wherein in the formula (9-1-1), n represents an average value, and is 3.9.

(B3) Epoxy compound 3 (trisphenolmethane type epoxy compound): epoxy compound (EPPN-502H, manufactured by NIPPON KAYAKU CO., LTD.), represented by the following formula (10-1)

[Chem. 34]

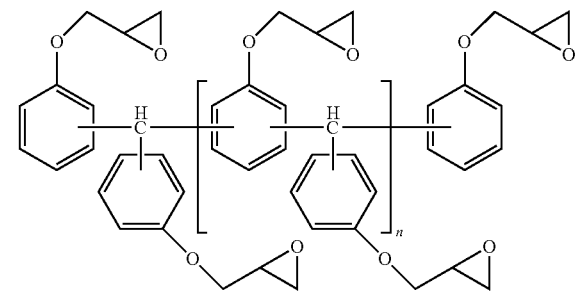

(10-1)

wherein in the formula (10-1), n is an average value and is 1.9

(B4) Epoxy compound 4 (alicyclic epoxy compound); compound (tricyclopentadiene diepoxide) of formula (5-2)

The compound (b) was synthesized in the same manner as the compound (a) described in (B1) above in accordance with the method described in the above-mentioned literature.

Next, the reaction of formula (7) was performed as follows. A reaction vessel was charged with 59.2 kg of chloroform and 4.0 kg of the compound (b), and 10.6 kg of meta-chloroperbenzoic acid was added dropwise thereto with stirring at −10° C. The temperature was raised to room temperature, and the reaction was performed for 12 hours.

Next, meta-chlorobenzoic acid as a by-product was removed by filtration, and thereafter, the filtrate was washed with 42.0 kg of an aqueous 5% sodium sulfite solution. The organic layer was further washed with 41.6 kg of an aqueous 1 N sodium hydroxide solution four times, and then washed with 48.0 kg of saturated saline. After the organic layer was dried over magnesium sulfate, the magnesium sulfate was removed by filtration and the filtrate was concentrated, to obtain 5.1 kg of a crude product.

To the crude product was added 3.5 kg of toluene, to dissolve the crude product at room temperature. Thereto was added dropwise 13.7 kg of heptane for crystallization, and the resultant was aged at 5° C. for 1 hour. The resultant crystallized product was collected by filtration and washed with heptane. The product was dried under reduced pressure at 35° C. for 12 hours, to obtain 2.8 kg of a compound represented by the following formula (5-2), as a white solid.

[Chem. 35]

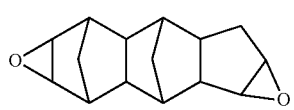

(5-2)

(B5) Alicyclic epoxy compound 5: compound (dicyclopentadiene diepoxide) of formula (5-4)

After a reaction vessel was charged with 10 kg of dicyclopentadiene, 68 kg of sodium bicarbonate, 100 L of acetone and 130 L of ion exchange water, and cooled to 10° C. or lower. Thereafter, while controlling the cooling so that the temperature of the reaction liquid was kept at 30° C. or lower, 84 kg of oxone was gradually added, and the reaction was performed with stirring for 10 hours.

Next, the reaction product was extracted with 100 L of ethyl acetate twice, and the resulting organic layers were fractionated and combined. Subsequently, the combined organic layer was washed with 100 L of a mixed aqueous solution of salt and sodium thiosulfate (20% weight of salt+20% weight of sodium thiosulfate), and then further washed with 100 L of ion exchange water twice.

After the washed organic layer was dried over magnesium sulfate, the magnesium sulfate was removed by filtration, and the organic solvent was distilled off from the filtrate, to obtain 11 kg of a compound represented by the following formula (5-4), as a white solid.

[Chem. 36]

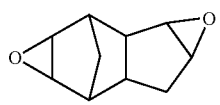
(5-4)

<Component (C): Curing Agent>

The following (C1) to (C4) were used as component (C).

(C1) Curing agent 1: bisphenol F (manufactured by HONSHU CHEMICAL INDUSTRY CO., LTD.), represented by the following formula (13-1)

[Chem. 37]

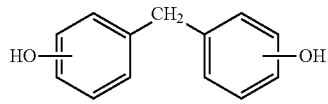
(13-1)

(C2) Curing agent 2: curing agent (MEHC-7851SS, manufactured by MEIWA PLASTIC INDUSTRIES, LTD.), represented by the following formula (13-2),

[Chem. 38]

(13-2)

wherein in the formula (13-2), n represents an average value and is 2.0.

(C3) Curing agent 3: curing agent (MEH-7800-4S, manufactured by MEIWA PLASTIC INDUSTRIES, LTD.), represented by the following formula (13-3),

[Chem. 39]

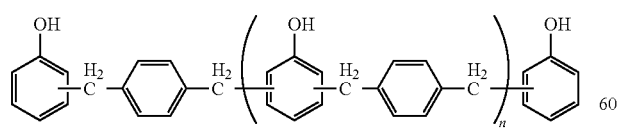
(13-3)

wherein in the formula (13-3), n represents an average value and is 4.8.

(C4) Curing agent 4: curing agent (TD-2106, manufactured by DIC CORPORATION), represented by the following formula (13-4),

[Chem. 40]

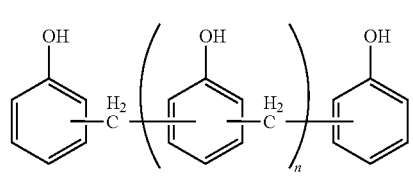
(13-4)

wherein in the formula (13-4), n represents an average value and is 8.7.

<Component (D): Curing Accelerator>

The following (D1) to (D4) were used as component (D).

(D1) Curing accelerator 1: triphenylphosphine (TPP) (manufactured by HOKKO CHEMICAL INDUSTRY CO., LTD.), represented by the following formula

[Chem. 41]

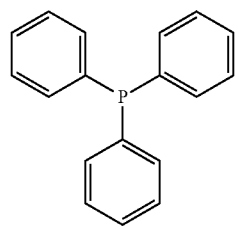

(D2) Curing accelerator 2: tetraphenylphosphonium tetraphenylborate (TPP-K (trademark)) (manufactured by HOKKO CHEMICAL INDUSTRY CO., LTD.), represented by the following formula

[Chem. 42]

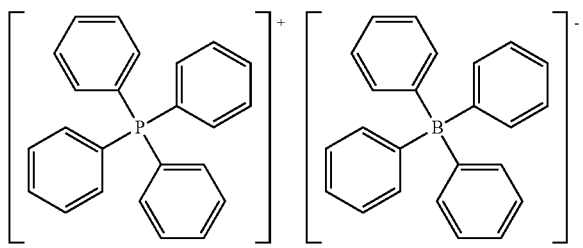

(D3) Curing accelerator 3: bis(tetrabutylphosphonium) (BTBP)-pyromellitic acid (manufactured by HOKKO CHEMICAL INDUSTRY CO., LTD.), represented by the following formula

[Chem. 43]

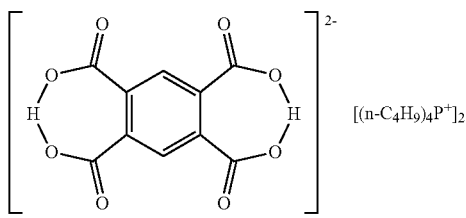

(D4) Curing accelerator 4: tetrabutylphosphonium 2,6-bis[(2-hydroxy-5-methylphenyl)methyl]-4-methylphenolate (TBP-3PC) (manufactured by HOKKO CHEMICAL INDUSTRY CO., LTD.), represented by the following formula

[Chem. 44]

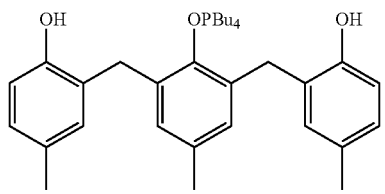

<Component (E): Inorganic Filler>
The following (E1) to (E3) were used as component (E).
Component (E1) inorganic filler 1: molten spherical silica (FB-820, manufactured by DENKA COMPANY LIMITED) having an average particle size D50 of 22 μm
Component (E2) inorganic filler 2: spherical alumina (TCH75H-SI, manufactured by ADMATECHS COMPANY LIMITED)
Component (E3) inorganic filler 3: magnetic powder (iron oxide) (DAMPMS-B (-200), manufactured by DAIDO STEEL CO., LTD.)
<Other Components>
Carnauba wax (manufactured by CLARIANT JAPAN K.K.) as a release agent and carbon black (MA600, manufactured by MITSUBISHI CHEMICAL CORPORATION) as a colorant were used.

Example 1

A curable resin composition (hereinafter referred to as a "composition" or "curable resin composition prior to curing") and a cured product were prepared as below-mentioned to measure the following: the weight-average molecular weight of the curable resin composition; the glass transition temperature of the cured product, for evaluation of heat resistance; and the powder Tg and stickiness of the curable resin composition, for evaluation of normal-temperature stability.

Components (A), (B1), and (C2) were kneaded at a compounding ratio shown in Table 1 on a hot plate with the surface temperature set to 100° C., under atmospheric pressure for 5 minutes, and then the resultant was cooled to room temperature to obtain a mixture. The mixture was ground into powdery form with a mortar, to obtain a composition.
<Glass Transition Temperature: Tg>
Approximately 10 mg of composition was weighed out into an aluminum pan to be used in DSC, and heated in an oven at 220° C. for 5 hours to obtain a cured product. The Tg of the resulting cured product was measured by DSC under the following conditions. The results are shown in Table 1.
Apparatus: X-DSC-7000 (manufactured by HITACHI HIGH-TECH SCIENCE CORPORATION)
Measurement conditions: flow rate of $N_2$; 20 mL/min, rate of temperature rise; 20° C./min
<Weight-average Molecular Weight>
Components (A), (B1), and (C2) were kneaded at a compounding ratio shown in Table 1 on a hot plate with the surface temperature set to 100° C., under atmospheric pressure for 5 minutes, and then the resultant was cooled to room temperature to obtain a mixture. The mixture was ground into powdery form with a mortar to obtain a compound. The resulting compound was measured for the weight-average molecular weight in terms of standard polystyrene by gel permeation chromatography (GPC) under the following conditions. The results are shown in Table 1.
Device: GPC system HLC-8420GPC (with an RI detector built in) (manufactured by TOSOH CORPORATION)
Column: TSKgel superHZ2000 (manufactured by TOSOH CORPORATION) (4.5 mm in inner diameter×150 mm)×1, and TSKgel superHZ1000 (manufactured by TOSOH CORPORATION) (4.5 mm in inner diameter×150 mm)×2, connected in series
Eluent: tetrahydrofuran
Flow rate: 0.35 mL/min
Detector: RI detector
Column temperature: 40° C.
Injection volume: 5 μL
Molecular weight standard: standard polystyrene (PStQuick F, manufactured by TOSOH CORPORATION)
<Powder Tg>
Approximately 10 mg of curable resin composition prior to curing was sampled into an aluminum pan, and measured for the glass transition temperature Tg (powder Tg) under the following conditions. The results are shown in Table 1.
Apparatus: X-DSC-7000 (manufactured by HITACHI HIGH-TECH SCIENCE CORPORATION) Measurement conditions: $N_2$ flow rate; 20 mL/min, rate of temperature rise; 5° C./min, and measurement range; −40 to 50° C.
<Stickiness Evaluation>
The curable resin composition prior to curing was sampled in an amount of 1 g into a screw bottle (lightweight standard bottle (soda glass) No. 7, from MARUEMU CORPORATION), the bottle was hermetically sealed with a lid, and then the composition was stored for 24 hours in a thermostatic chamber adjusted to a temperature of 23±1° C. and a humidity of 50±5%. Then, the screw bottle was turned upside down and left to stand for five minutes. Then, when the composition was not adhered to the bottom of the bottle, the composition was evaluated as "○" (not sticky). When the composition was adhered to the bottom of the bottle and did not fall toward the lid, the composition was evaluated as "x" (sticky). When the composition was partially adhered to the bottom of the bottle, the composition was also evaluated as "x" (sticky). The results are shown in Table 1.

Examples 2 to 14, 26, and 27

Each composition of the Examples was prepared in the same manner as in Example 1 except that the compounding ratio of each of the components was as shown in Table 1. Each of the compositions was measured for the weight-average molecular weight, heat resistance (glass transition temperature), and normal-temperature stability (powder Tg and stickiness) in the same manner as in Example 1. Here, the compound in each of Examples 4 to 6 was consisting of components (A), (B), and (C), and did not contain component (D). The results are shown in Table 1.

Comparative Examples 1 to 8

Each composition of Comparative Examples was prepared in the same manner as in Example 1 except that the compounding ratio of each of the components was as shown in Table 2. Each of the compositions was measured for the weight-average molecular weight, heat resistance (glass transition temperature), and normal-temperature stability (powder Tg and stickiness) in the same manner as in Example 1. Here, the compound in Comparative Example 2 was consisting of components (A), (B), and (C), and did not contain component (D). The results are shown in Table 2.

TABLE 1

| | | | Example | | | | | | | | | | | | | | | |
|---|---|---|---|---|---|---|---|---|---|---|---|---|---|---|---|---|---|---|
| | | | 1 | 26 | 27 | 2 | 3 | 4 | 5 | 6 | 7 | 8 | 9 | 10 | 11 | 12 | 13 | 14 |
| Component (parts by mass) | Multi-functional benzoxazine compound | (A) | 55.3 | 54.3 | 60.3 | 54.6 | 52.3 | 53.4 | 52.8 | 50.6 | 44.8 | 48.2 | 47.5 | 44.8 | 48.2 | 51.5 | 50.9 | 48.5 |
| | Epoxy compound | (B1) | 33.7 | — | — | 34.5 | 37.2 | 32.6 | 33.3 | 36.0 | 23.1 | 21.1 | 21.5 | 23.1 | 21.1 | 19.1 | 19.5 | 20.9 |
| | | (B4) | — | 34.9 | — | — | — | — | — | — | — | — | — | — | — | — | — | — |
| | | (B5) | — | — | 27.6 | — | — | — | — | — | — | — | — | — | — | — | — | — |
| | | (B2) | — | — | — | — | — | — | — | — | 23.1 | 21.1 | 21.5 | 23.1 | — | — | — | — |
| | | (B3) | — | — | — | — | — | — | — | — | — | — | — | — | 21.1 | 19.1 | 19.5 | 20.9 |
| | Curing agent | (C1) | — | — | — | — | — | — | — | — | 9.0 | — | — | — | 9.6 | — | — | — |
| | | (C2) | 11.0 | 10.8 | 12.1 | — | — | 10.7 | — | — | — | 9.6 | — | — | — | 10.3 | — | — |
| | | (C3) | — | — | — | 10.9 | — | — | 10.6 | — | — | — | 9.5 | — | — | — | 10.1 | — |
| | | (C4) | — | — | — | — | 10.5 | — | — | 10.1 | — | — | — | 9.0 | — | — | — | 9.7 |
| | Curing accelerator | (D2) | — | — | — | — | — | 3.3 | 3.3 | 3.3 | — | — | — | — | — | — | — | — |
| Performance evaluation | Total | — | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 | 100.0 |
| | Weight-average molecular weight of compound consisting of components (A) to (C) (measured value) | | 363 | 363 | 365 | 389 | 385 | 363 | 389 | 385 | 549 | 599 | 626 | 640 | 473 | 506 | 533 | 540 |
| | Glass transition temperature (Tg) | [° C.] | 226 | 235 | 224 | 228 | 240 | 246 | 242 | 254 | 220 | 222 | 221 | 226 | 247 | 246 | 250 | 260 |
| | Powder Tg | [° C.] | 6.8 | 12.3 | 8.7 | 5.7 | 6.8 | 6.5 | 5.1 | 5.9 | 10.9 | 14.9 | 14.8 | 16.9 | 8.9 | 15.8 | 15.0 | 15.0 |
| | Stickiness | | ○ | ○ | ○ | ○ | ○ | ○ | ○ | ○ | ○ | ○ | ○ | ○ | ○ | ○ | ○ | ○ |

TABLE 2

| | | | Comparative Example | | | | | | | |
|---|---|---|---|---|---|---|---|---|---|---|
| | | | 1 | 2 | 3 | 4 | 5 | 6 | 7 | 8 |
| Component (parts by mass) | Multifunctional benzoxazine compound | (A) | 52.1 | 50.4 | 51.4 | 32.2 | 35.7 | 35.0 | 32.6 | 43.3 |
| | Epoxy compound | (B1) | 37.5 | 36.3 | 34.5 | — | — | — | — | — |
| | | (B2) | — | — | 3.8 | 61.4 | 57.1 | 58.0 | 60.9 | — |
| | | (B3) | — | — | — | — | — | — | — | 48.0 |
| | Curing agent | (C1) | 10.4 | 10.0 | 10.3 | 6.4 | — | — | — | 8.7 |
| | | (C2) | — | — | — | — | 7.2 | — | — | — |

TABLE 2-continued

| | | | Comparative Example | | | | | | | |
|---|---|---|---|---|---|---|---|---|---|---|
| | | | 1 | 2 | 3 | 4 | 5 | 6 | 7 | 8 |
| | | (C3) | — | — | — | — | — | 7.0 | — | — |
| | | (C4) | — | — | — | — | — | — | 6.5 | — |
| | Curing accelerator | (D2) | — | 3.3 | — | — | — | — | — | — |
| Performance evaluation | Total | — | 100.0 | 100.0 | 100.0 | 100.0 | 100.0 | 100.0 | 100.0 | 100.0 |
| | Weight-average molecular weight of compound consisting of components (A) to (C) (measured value) | | 284 | 284 | 336 | 1004 | 1001 | 1027 | 1057 | 664 |
| | Glass transition temperature (Tg) | [° C.] | 233 | 252 | 229 | 158 | 162 | 163 | 168 | 212 |
| | Powder Tg | [° C.] | 1.0 | 0.7 | 2.6 | 30.4 | 31.9 | 32.2 | 32.1 | 23.9 |
| | Stickiness | | x | x | x | ○ | ○ | ○ | ○ | ○ |

The cured product of the curable resin composition in each Example had a Tg of 220° C. or higher, and it was found that the products exhibited high heat resistance. In addition, the curable resin composition prior to curing in each of Examples had a powder Tg of 3° C. or higher and was not sticky, and it was found that the compositions were excellent in normal-temperature stability. In this regard, the curable resin composition in each of Examples 7 to 14 was not sticky even when stored in a thermostatic chamber for 24 hours. When the bottle was turned upside down, the whole composition fell toward the lid, maintaining the shape of the bottom of the bottle. Accordingly, the curable resin composition in each of Examples 7 to 14 is considered to be less sticky than the curable resin composition in each of Examples 1 to 6, 26, and 27. On the other hand, the cured product obtained by curing the curable resin composition in each of Comparative Examples 4 and 8 had a lower Tg and lower heat resistance. In addition, the curable resin composition prior to curing in each of Comparative Examples 1 to 3 had a powder Tg of lower than 3° C. and was sticky, and it was found that the compositions were inferior in normal-temperature stability.

The above-mentioned results have revealed that a curable resin composition according to an embodiment of the present invention was excellent in normal-temperature stability, and that a cured product of the composition has achieved high heat resistance.

Example 15

A curable resin composition (hereinafter referred to as a "composition" or "curable resin composition prior to curing") and a cured product were prepared as below-mentioned to measure the following: the weight-average molecular weight of the curable resin composition; the glass transition temperature of the cured product, for evaluation of heat resistance; and the consolidation properties of the curable resin composition, for evaluation of normal-temperature stability.

After (A), (B1), (C2), (D1), (E1), carnauba wax, and carbon black were kneaded at a compounding ratio shown in Table 3, by use of a heat roll kneader including the respective two rolls having surface temperatures of 90° C. and 100° C. (BR-150HCV, from AIMEX CO., Ltd.), under atmospheric pressure for 10 minutes, the resultant was cooled to room temperature to obtain a mixture. The resulting mixture was pulverized into powdery form using Mini Speed Mill MS-09 (manufactured by LABONECT CO., LTD.) so that packing into a mold was favorably performed, thereby obtaining a composition.

<Glass Transition Temperature: Tg>

The composition prepared was cured using a transfer molding machine under conditions at a mold temperature of 200° C. at an injection pressure of 4 MPa for a curing time of 3 minutes, and the resulting product was further heated in a post-curing treatment in an oven at 220° C. for 4 hours to produce a cured product, 3 mm in vertical×3 mm in horizonal×15 mm in length. The cured product was cut to provide a test piece having a size of 3 mm in vertical×3 mm in horizonal×2 mm in length, and the test piece was used to measure Tg by DSC under the following conditions. The results are shown in Table 3.

Apparatus: X-DSC-7000 (manufactured by HITACHI HIGH-TECH SCIENCE CORPORATION)

Measurement conditions: flow rate of $N_2$; 20 mL/min, rate of temperature rise; 20° C./min <Weight-average Molecular Weight>

A compound consisting of components (A), (B), and (C) of the composition in Example 15 was produced, and the compound was measured for the weight-average molecular weight in terms of standard polystyrene by GPC in the same manner as Example 1. Specifically, components (A), (B1), and (C2) were kneaded at a compounding ratio shown in Table 3 on a hot plate with the surface temperature set to 100° C., under atmospheric pressure for 5 minutes, and then the resultant was cooled to room temperature to obtain a mixture. The mixture was ground into powdery form with a mortar to obtain a compound. The weight-average molecular weight of the resulting compound was measured by GPC. The results are shown in Table 3.

<Consolidation Properties Evaluation>

The curable resin composition prior to curing was sampled in an amount of 1 g into a screw bottle (lightweight standard bottle (soda glass) No. 7, from MARUEMU CORPORATION), the bottle was hermetically sealed with a lid, and then, the composition was stored for 24 hours in a thermostatic chamber adjusted to a temperature of 23±1° C. and a humidity of 50±5%. Then, the bottle was turned upside down and left to stand, and after five minutes, a verification was performed according to whether the composition was consolidated. As a result, the composition was evaluated as "○" when no consolidation was found, or when any consolidated composition was loosened by turning the bottle upside down. The composition was evaluated as "x" when the composition was found to be consolidated even by turning the bottle upside down. The results are shown in Table 3.

Examples 16 to 25

Each composition of the Examples was prepared in the same manner as in Example 15 except that the compounding ratio of each of the components was as shown in Table 3. Each of the compositions was measured for the weight-average molecular weight, heat resistance evaluation (glass transition temperature), and normal-temperature stability (consolidation properties) in the same manner as in Example 15. The results are shown in Table 3.

Comparative Examples 9 to 12

Each composition of Comparative Examples was prepared in the same manner as in Example 15 except that the compounding ratio of each of the components was as shown in Table 4. Each of the compositions was measured for the weight-average molecular weight, heat resistance evaluation (glass transition temperature), and normal-temperature stability (consolidation properties) in the same manner as in Example 15. The results are shown in Table 4.

TABLE 3

| | | | Example | | | | | | | | | | |
|---|---|---|---|---|---|---|---|---|---|---|---|---|---|
| | | | 15 | 16 | 17 | 18 | 19 | 20 | 21 | 22 | 23 | 24 | 25 |
| Component (parts by mass) | Multifunctional benzoxazine compound | (A) | 7.7 | 7.7 | 7.7 | 7.7 | 7.7 | 7.7 | 7.6 | 7.3 | 6.8 | 6.2 | 6.7 |
| | Epoxy compound | (B1) | 4.7 | 4.7 | 4.7 | 4.7 | 4.7 | 4.7 | 4.8 | 5.2. | 4.3 | 3.2 | 2.9 |
| | | (B2) | — | — | — | — | — | — | — | — | 1.4 | 3.2 | — |
| | | (B3) | — | — | — | — | — | — | — | — | — | — | 2.9 |
| | Curing agent | (C1) | — | — | — | — | — | — | — | — | 1.4 | 1.3 | 1.4 |
| | | (C2) | 1.5 | 1.5 | 1.5 | 1.5 | 1.5 | 1.5 | — | — | — | — | — |
| | | (C3) | — | — | — | — | — | — | 1.5 | — | — | — | — |
| | | (C4) | — | — | — | — | — | — | — | 1.4 | — | — | — |
| | Curing accelerator | (D1) | 0.5 | 0.5 | 0.5 | — | — | — | — | — | — | — | — |
| | | (D2) | — | — | — | 0.5 | — | — | 0.5 | 0.5 | 0.5 | 0.5 | 0.5 |
| | | (D3) | — | — | — | — | 0.5 | — | — | — | — | — | — |
| | | (D4) | — | — | — | — | — | 0.5 | — | — | — | — | — |
| | Inorganic filler | (E1) | 85.0 | — | — | 85.0 | 85.0 | 85.0 | 85.0 | 85.0 | 85.0 | 85.0 | 85.0 |
| | | (E2) | — | 85.0 | — | — | — | — | — | — | — | — | — |
| | | (E3) | — | — | 85.0 | — | — | — | — | — | — | — | — |
| | Release agent | carnauba wax | 0.3 | 0.3 | 0.3 | 0.3 | 0.3 | 0.3 | 0.3 | 0.3 | 0.3 | 0.3 | 0.3 |
| | Colorant | carbon black | 0.3 | 0.3 | 0.3 | 0.3 | 0.3 | 0.3 | 0.3 | 0.3 | 0.3 | 0.3 | 0.3 |
| | Total | | 100.0 | 100.0 | 100.0 | 100.0 | 100.0 | 100.0 | 100.0 | 100.0 | 100.0 | 100.0 | 100.0 |
| Performance evaluation | Weight-average molecular weight of compound consisting of components (A) to (C) (measured value) | — | 362.7 | 362.7 | 362.7 | 362.7 | 362.7 | 362.7 | 388.9 | 384.8 | 412.0 | 560.2 | 454.6 |
| | Glass transition temperature (Tg) | [° C.] | 238 | 239 | 237 | 243 | 248 | 256 | 239 | 245 | 237 | 231 | 253 |
| | Consolidation properties | — | ○ | ○ | ○ | ○ | ○ | ○ | ○ | ○ | ○ | ○ | ○ |

TABLE 4

| | | | Comparative Example | | | |
|---|---|---|---|---|---|---|
| | Component | | 9 | 10 | 11 | 12 |
| Component (parts by mass) | Multifunctional benzoxazine compound | (A) | 7.2 | 4.5 | 4.9 | 6.0 |
| | Epoxy compound | (B1) | 5.2 | — | — | — |
| | | (B2) | — | 8.5 | 8.0 | — |
| | | (B3) | — | — | — | 6.7 |
| | Curing agent | (C1) | 1.5 | 0.9 | — | 1.2 |
| | | (C2) | — | — | 1.0 | — |
| | | (C3) | — | — | — | — |
| | | (C4) | — | — | — | — |
| | Curing accelerator | (D1) | — | — | — | — |
| | | (D2) | 0.5 | 0.5 | 0.5 | 0.5 |
| | | (D3) | — | — | — | — |
| | | (D4) | — | — | — | — |

TABLE 4-continued

| | Component | | Comparative Example 9 | 10 | 11 | 12 |
|---|---|---|---|---|---|---|
| | Inorganic filler | (E1) | 85.0 | 85.0 | 85.0 | 85.0 |
| | | (E2) | — | — | — | — |
| | | (E3) | — | — | — | — |
| | Release agent | carnauba wax | 0.3 | 0.3 | 0.3 | 0.3 |
| | Colorant | carbon black | 0.3 | 0.3 | 0.3 | 0.3 |
| | Total | | 100.0 | 100.0 | 100.0 | 100.0 |
| Performance evaluation | Weight-average molecular weight of compound consisting of components (A) to (C) (measured value) | — | 291.3 | 1004.3 | 1003.6 | 663.7 |
| | Glass transition temperature (Tg) | [° C.] | 253 | 161 | 165 | 224 |
| | Consolidation properties | — | x | ○ | ○ | ○ |

The cured product of the curable resin composition in each Example had a Tg of 230° C. or higher, and it was found that the products exhibited high heat resistance. In addition, the curable resin composition prior to curing in each of Examples had an evaluation of consolidation properties being "○", and it was found that the compositions were excellent in normal-temperature stability. Among these, Examples 24 and 25 were particularly free from consolidation of the composition. On the other hand, the cured product obtained by curing the curable resin composition in each of Comparative Examples 10 and 12 had a lower Tg and lower heat resistance. In addition, the curable resin composition prior to curing in Comparative Example 9 had an evaluation of consolidation properties being "x", and it was found that the composition was inferior in normal-temperature stability.

The above-mentioned results have revealed that a curable resin composition according to an embodiment of the present invention was excellent in normal-temperature stability, and that a cured product of the composition has achieved high heat resistance.

The invention claimed is:

1. A curable resin composition comprising:
(A) a multifunctional benzoxazine compound having at least two benzoxazine rings, the compound being at least one multifunctional benzoxazine compound selected from
(1) a multifunctional benzoxazine compound having a structural unit of formula (1)

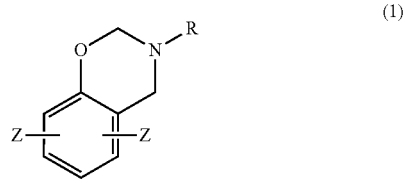

wherein R represents a linear alkyl group having 1 to 12 carbon atoms, a cyclic alkyl group having 3 to 8 carbon atoms, or an aryl group having 6 to 14 carbon atoms, wherein the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and the benzoxazine rings are linked by the linking group; and
(2) a multifunctional benzoxazine compound represented by a structure of formula (2)

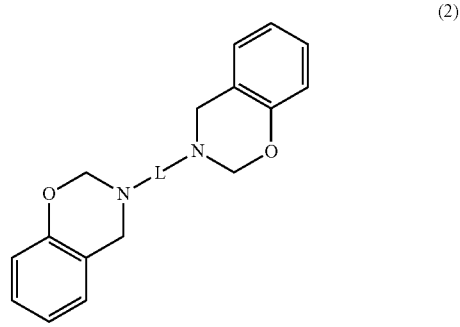

wherein L represents a divalent organic group having 1 to 5 aromatic rings or an alkylene group having 2 to 10 carbon atoms, and the organic group and the alkylene group optionally contain oxygen and/or sulfur;
(B) an epoxy compound containing (1) at least one epoxy compound having at least one norbornane structure and at least two epoxy groups, and (2) at least one epoxy compound selected from the group consisting of epoxy compounds having a biphenyl backbone and trisphenolmethane type epoxy compounds; and
(C) a curing agent,
wherein a composition consisting of (A), (B), and (C) has a weight-average molecular weight of 400 or more and 650 or less in terms of polystyrene.

2. The curable resin composition according to claim 1, wherein (B) the epoxy compound having at least one norbornane structure and at least two epoxy groups is an alicyclic epoxy compound.

3. The curable resin composition according to claim 1, wherein (B) the epoxy compound having at least one norbornane structure and at least two epoxy groups has no glycidyl group.

4. The curable resin composition according to claim 1, wherein (B) the epoxy compound further comprises at least one selected from the group consisting of naphthalene type epoxy compounds, novolac type epoxy compounds, and phenolaralkyl type epoxy compounds.

5. The curable resin composition according to claim 1, further comprising (D) a curing accelerator.

6. The curable resin composition according to claim 1, further comprising (E) an inorganic filler.

7. A cured product obtained by curing the curable resin composition according to claim 1.

8. A semiconductor device, wherein a semiconductor element is disposed in a cured product obtained by curing the curable resin composition according to claim 1.

9. A method of producing the curable resin composition according to claim 1, the method comprising the steps of:
mixing
(A) a multifunctional benzoxazine compound having at least two benzoxazine rings, the compound being at least one multifunctional benzoxazine compound selected from
(1) a multifunctional benzoxazine compound having a structural unit of formula (1)

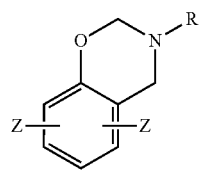

(1)

wherein R represents a linear alkyl group having 1 to 12 carbon atoms, a cyclic alkyl group having 3 to 8 carbon atoms, or an aryl group having 6 to 14 carbon atoms, wherein the aryl group optionally has halogen or a linear alkyl group having 1 to 12 carbon atoms, as a substituent; and each Z represents hydrogen, a hydrocarbon group having 1 to 8 carbon atoms and/or a linking group and is optionally the same or different; at least one Z represents a linking group, and the benzoxazine rings are linked by the linking group; and
(2) a multifunctional benzoxazine compound represented by a structure of formula (2)

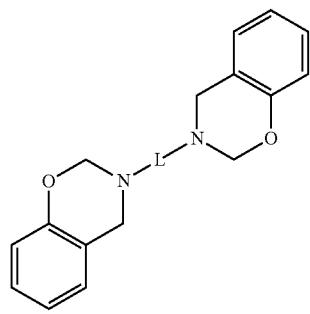

(2)

wherein L represents a divalent organic group having 1 to 5 aromatic rings or an alkylene group having 2 to 10 carbon atoms, and the organic group and the alkylene group optionally contain oxygen and/or sulfur, (B) an epoxy compound containing (1) at least one epoxy compound having at least one norbornane structure and at least two epoxy groups, and (2) at least one epoxy compound selected from the group consisting of epoxy compounds having a biphenyl backbone and trisphenolmethane type epoxy compounds, and (C) a curing agent, to obtain a mixture; and processing the mixture into a powdery, pelletized, or granular curable resin composition.

10. The production method according to claim 9, wherein the step of obtaining a mixture comprises further mixing (D) a curing accelerator and/or (E) an inorganic filler to obtain the mixture.

11. A method of producing a cured product, comprising a step of heating the curable resin composition produced by the method according to claim 9, at 150 to 300° C. for 20 seconds to 5 hours for curing.

12. A method of producing a cured product, comprising a step of heating the curable resin composition produced by the method according to claim 10, at 150 to 300° C. for 20 seconds to 5 hours for curing.

13. The curable resin composition according to claim 2, wherein (B) the epoxy compound having at least one norbornane structure and at least two epoxy groups has no glycidyl group.

14. The curable resin composition according to claim 13, wherein (B) the epoxy compound further comprises at least one selected from the group consisting of naphthalene type epoxy compounds, novolac type epoxy compounds, and phenolaralkyl type epoxy compounds.

15. The curable resin composition according to claim 14, further comprising (D) a curing accelerator.

16. The curable resin composition according to claim 15, further comprising (E) an inorganic filler.

17. A cured product obtained by curing the curable resin composition according to claim 16.

18. A semiconductor device, wherein a semiconductor element is disposed in a cured product obtained by curing the curable resin composition according to claim 16.

19. The curable resin composition according to claim 4, further comprising (D) a curing accelerator.

20. The curable resin composition according to claim 1, wherein the compounding ratio (mass ratio) between the epoxy compound having at least one norbornane structure and at least two epoxy groups, and at least one epoxy compound selected from the group consisting of epoxy compounds having a biphenyl backbone and trisphenolmethane type epoxy compounds is 85:15 to 15:85.

* * * * *